United States Patent
Tobita

(10) Patent No.: US 7,738,623 B2
(45) Date of Patent: Jun. 15, 2010

(54) SHIFT REGISTER CIRCUIT AND IMAGE DISPLAY APPARATUS CONTAINING THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 130 days.

(21) Appl. No.: 11/856,264

(22) Filed: Sep. 17, 2007

(65) Prior Publication Data

US 2008/0080661 A1    Apr. 3, 2008

(30) Foreign Application Priority Data

Oct. 3, 2006    (JP) ............................. 2006-271555
Jun. 11, 2007    (JP) ............................. 2007-153434

(51) Int. Cl.
*G11C 19/00* (2006.01)

(52) U.S. Cl. ............................. 377/64; 377/68; 377/69

(58) Field of Classification Search .................. 377/64, 377/68–74, 75, 77–79
See application file for complete search history.

(56) References Cited

U.S. PATENT DOCUMENTS

| | | | |
|---|---|---|---|
| 5,434,899 A | 7/1995 | Huq et al. | |
| 5,949,398 A * | 9/1999 | Kim | ............................. 345/100 |
| 6,919,874 B1 | 7/2005 | Maurice | |
| 7,369,111 B2 * | 5/2008 | Jeon et al. | .................... 345/100 |
| 2002/0097829 A1 | 7/2002 | Kawahata | |
| 2004/0217935 A1 * | 11/2004 | Jeon et al. | .................... 345/100 |
| 2006/0001637 A1 | 1/2006 | Park et al. | |
| 2006/0210012 A1 * | 9/2006 | Yamaguchi et al. | ........... 377/64 |
| 2006/0238482 A1 * | 10/2006 | Jang et al. | .................... 345/100 |
| 2007/0248204 A1 | 10/2007 | Tobita | |
| 2007/0274433 A1 | 11/2007 | Tobita | |

FOREIGN PATENT DOCUMENTS

| | | |
|---|---|---|
| JP | 8-87897 | 4/1996 |
| JP | 10-500243 | 1/1998 |
| JP | 2001-52494 | 2/2001 |
| JP | 2002-133890 | 5/2002 |
| JP | 2006-24350 | 1/2006 |

OTHER PUBLICATIONS

U.S. Appl. No. 11/937,791, filed Nov. 9, 2007, Tobita.

* cited by examiner

*Primary Examiner*—Tuan Lam
(74) *Attorney, Agent, or Firm*—Oblon, Spivak, McClelland, Maier & Neustadt, L.L.P.

(57) ABSTRACT

A high-speed shift register circuit is provided. The shift register circuit includes a first transistor supplying a clock signal to a first output terminal, a second transistor discharging the first output terminal, a third transistor supplying the above clock signal to a second output terminal, and a fourth transistor discharging the second output terminal. The gates of the first and third transistors are both connected to a first node, and the gates of the second and fourth transistors are both connected to a second node. The first node is charged by a fifth transistor which is connected between the first node and a first input terminal and which has a gate connected to a second input end.

21 Claims, 19 Drawing Sheets

PRIOR ART

F I G . 3
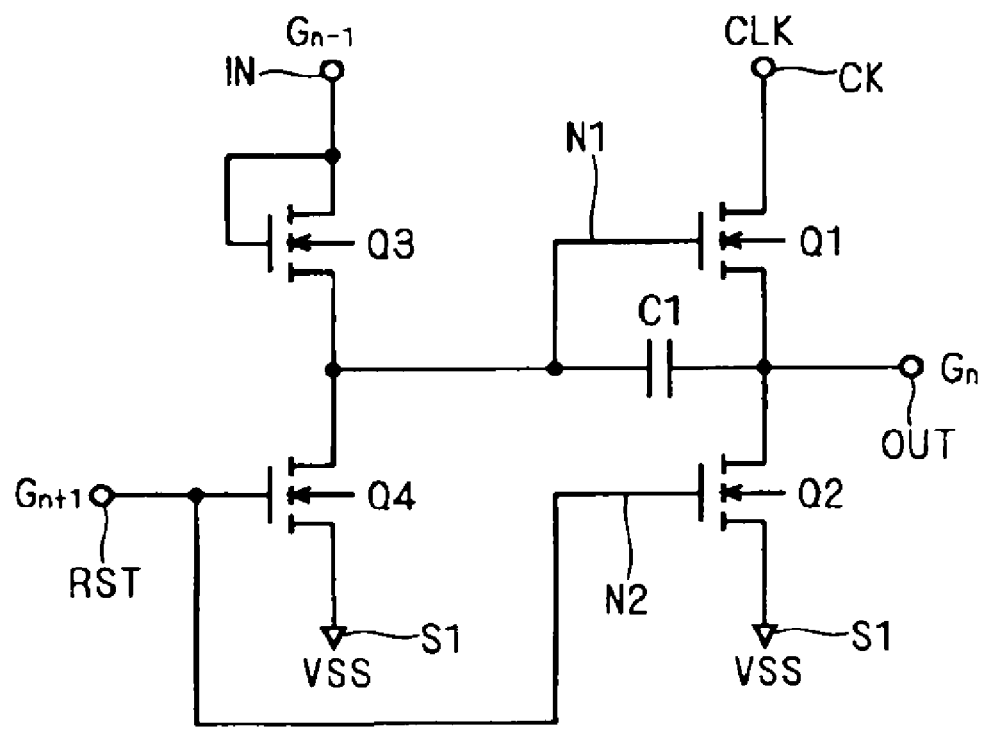
PRIOR ART

F I G . 6
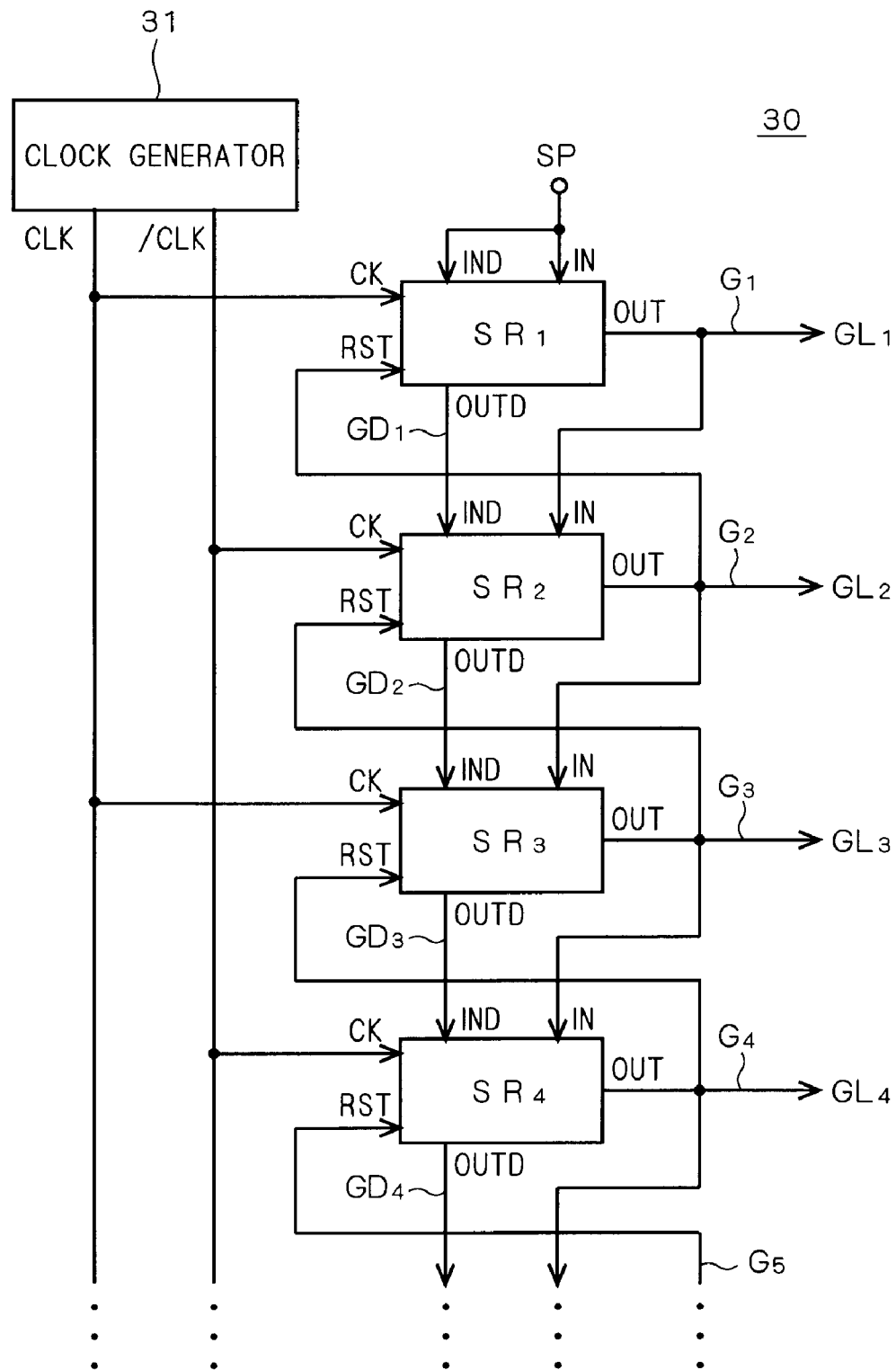

F I G . 1 2
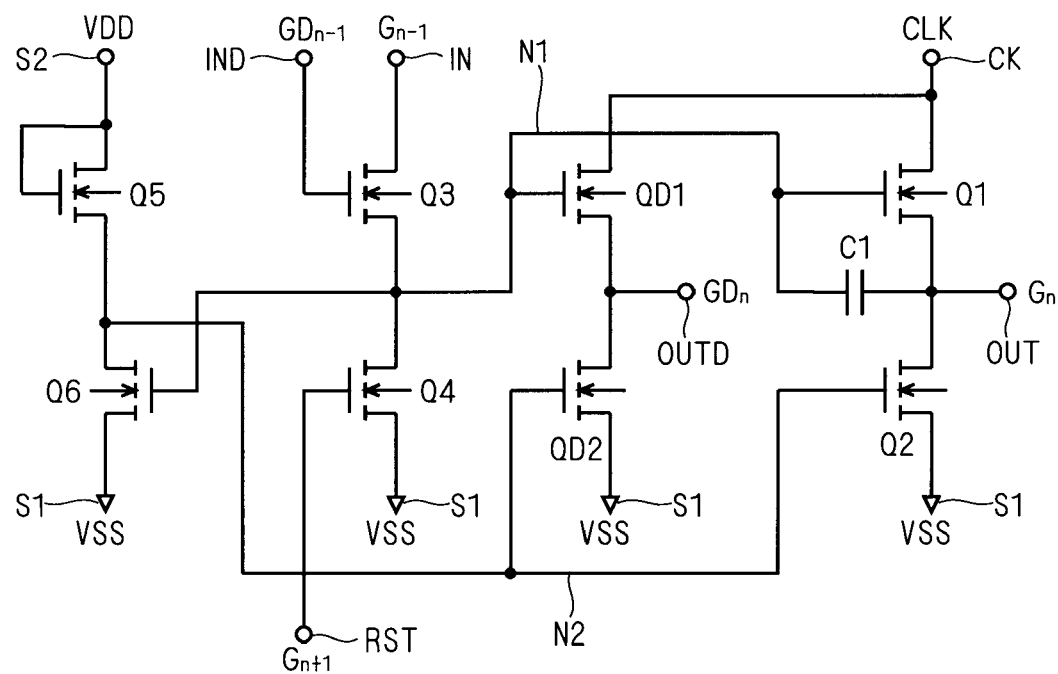

F I G . 1 4
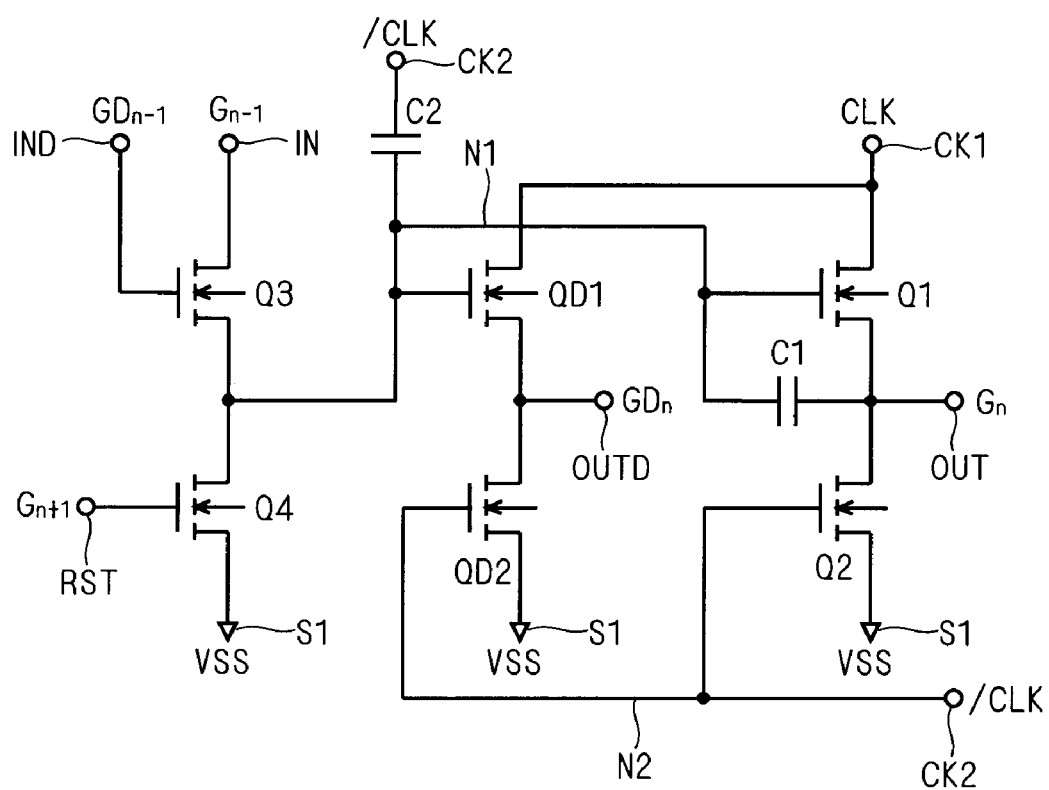

SHIFT REGISTER CIRCUIT AND IMAGE DISPLAY APPARATUS CONTAINING THE SAME

BACKGROUND OF THE INVENTION

1. Field of the Invention

The present invention relates to a shift register circuit, and more particularly to a shift register circuit for use as a scanning line driving circuit in an image display apparatus or the like and constituted by only field-effect transistors of the same conductivity type.

2. Description of the Background Art

In an image display apparatus (hereinafter referred to as a "display apparatus") such as a liquid crystal display, a plurality of pixels are arranged in a matrix in a display panel and a gate line (scanning line) is provided for each row of pixels (pixel line) of the display panel. In a cycle of one horizontal period of a display signal, the gate lines are sequentially selected and driven to update a display image. As a gate line driving circuit (scanning line driving circuit) for sequentially selecting and driving pixel lines, i.e., gate lines, a multi-stage shift register may be used, which performs a round of shift operation in one frame period of a display signal.

In order to reduce the number of steps in the manufacturing process of a display apparatus, a shift register for use as a gate line driving circuit should preferably be constituted by only field-effect transistors of the same conductivity type. Therefore, various types of shift registers constituted by only N- or P-type field-effect transistors, and various display apparatus containing such shift registers have been proposed (e.g., in Japanese Patent Application Laid-open Nos. 8-87897, 10-500243, 2001-52494, and 2002-133890). As a field-effect transistor, a MOS (Metal Oxide Semiconductor) transistor, a thin film transistor (TFT) or the like is used.

A multi-stage shift register for use as a gate line driving circuit is constituted by a plurality of cascade-connected shift register circuits, each of which is provided for each pixel line, i.e., each gate line. In this specification, for convenience of description, each of a plurality of shift register circuits forming a gate line driving circuit (a multi-stage shift register) is referred to as a "unit shift register."

As shown in Japanese Patent Application Laid-open Nos. 8-87897, 10-500243, 2001-52494, and 2002-133890 (and FIG. 3 of this specification), a conventional unit shift register includes a transistor (hereinafter referred to as an "output pull-up transistor") (e.g., a transistor Q1 in FIG. 3) connected between a clock terminal and an output terminal. The unit shift register outputs (activates) an output signal when the output pull-up transistor is turned on and a clock signal inputted to the clock terminal is transmitted to the output terminal.

Hence, in order to speed up the operation of a unit shift register, the rising and falling speeds of the output signal (the speed of the level transitions) need to be increased. For this to be achieved, the output pull-up transistor should have a high drive capability (a capability to pass current) during signal output. One method for this is to increase the channel width of the output pull-up transistor, which however involves the problem of increased area of the circuit.

Another method for improving the drive capability of the output pull-up transistor is to maintain a high gate-source voltage of the output pull-up transistor even during signal output. Since the source of the output pull-up transistor is connected to an output terminal, the source potential increases at the time of signal output; however, at the same time, the gate potential also increases due to capacitive coupling through a gate-channel capacitance, so that the gate-source voltage during that time remains almost unchanged. That is, in order to maintain a high gate-source voltage of the output pull-up transistor during signal output, it is necessary to increase the gate potential of the output pull-up transistor to a sufficiently high level before signal output (before input of a clock signal). For this, precharging the gate electrode at high speed is effective.

In a unit shift register shown in Japanese Patent Application Laid-open Nos. 8-87897, 10-500243, 2001-52494, and 2002-133890, the gate electrode of the output pull-up transistor is connected to a diode-connected transistor (hereinafter referred to as a "charger transistor"). The gate electrode of the output pull-up transistor is charged with supply of an output signal of a unit shift register of the preceding stage through the charger transistor.

However, in a shift register when used as a gate line driving circuit, output terminals of unit shift registers are connected to gate lines which can be large capacitive loads, so that the rising speeds of the output signals become slow. This slows down the speed of charging of the gate electrode of the output pull-up transistor in each unit shift register, resulting in difficulty in speeding up the operation of each unit shift register and thus difficulty in speeding up the operation of the gate line driving circuit.

The charger transistor operates in a source-follower mode during charge of the gate electrode of the output pull-up transistor. That is, as charging proceeds, the gate-source voltage of the charger transistor decreases and the speed of charging slows down with decreasing drive capability. Especially when the rising speed of the output signal of each unit shift register slows down due to the influence of a large capacitive load such as a gate line, the slowdown of the charging speed becomes remarkable because the charger transistor operates in the source-follower mode from the early stage of the charging process. This also becomes a preventing factor of speeding up the operation of the gate line driving circuit.

SUMMARY OF THE INVENTION

An object of the present invention is to speed up the charging of a gate electrode of an output pull-up transistor in a shift register for use as a gate line driving circuit or the like, thereby allowing a high-speed operation of the shift register.

A shift register circuit according to the present invention includes first and second input terminals, first and second output terminals, a first clock terminal, a reset terminal, and first to sixth transistors described below. The first transistor supplies a first clock signal inputted to the first clock terminal to the first output terminal. The second transistor discharges the first output terminal. The third transistor supplies the first clock signal to the second output terminal. The fourth transistor discharges the second output terminal. The fifth transistor is connected between a predetermined node, which is connected to control electrodes of both the first and third transistors, and the first input terminal and has a control electrode connected to the second input terminal. The sixth transistor has a control electrode connected to the reset terminal and discharges the predetermined node.

In the shift register circuit according to the present invention, inputting to the second input terminal an input signal which is faster in level transition than an input signal of the first input terminal allows the fifth transistor to operate in a nonsaturated region from the early stage in the process of charging the predetermined node, thereby allowing the predetermined node to be charged to a high potential at high speed. This consequently improves drive capabilities of the first and third transistors, thus achieving the effect of speeding up level transitions of output signals from the first and second output terminals.

Further, due to different loads connected to the first and second output terminals, the level transitions of the output signals from the first and second output terminals occur at different speeds. When a plurality of such shift register circuits are connected in cascade, each of the cascade-connected shift register circuits can achieve the aforementioned effect by inputting one of the output signals from the first and second output terminals which is faster in level transition than the other, to the second input terminal of a succeeding stage and by inputting the other to the first input terminal of the succeeding stage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing a configuration of a conventional unit shift register;

FIG. 6 is a block diagram showing a configuration of a gate line driving circuit according to the first preferred embodiment;

FIG. 12 is a circuit diagram showing a configuration of a unit shift register according to a fourth preferred embodiment;

FIG. 14 is a circuit diagram showing a configuration of a unit shift register according to a sixth preferred embodiment;

DESCRIPTION OF THE PREFERRED EMBODIMENTS

Figure 1:
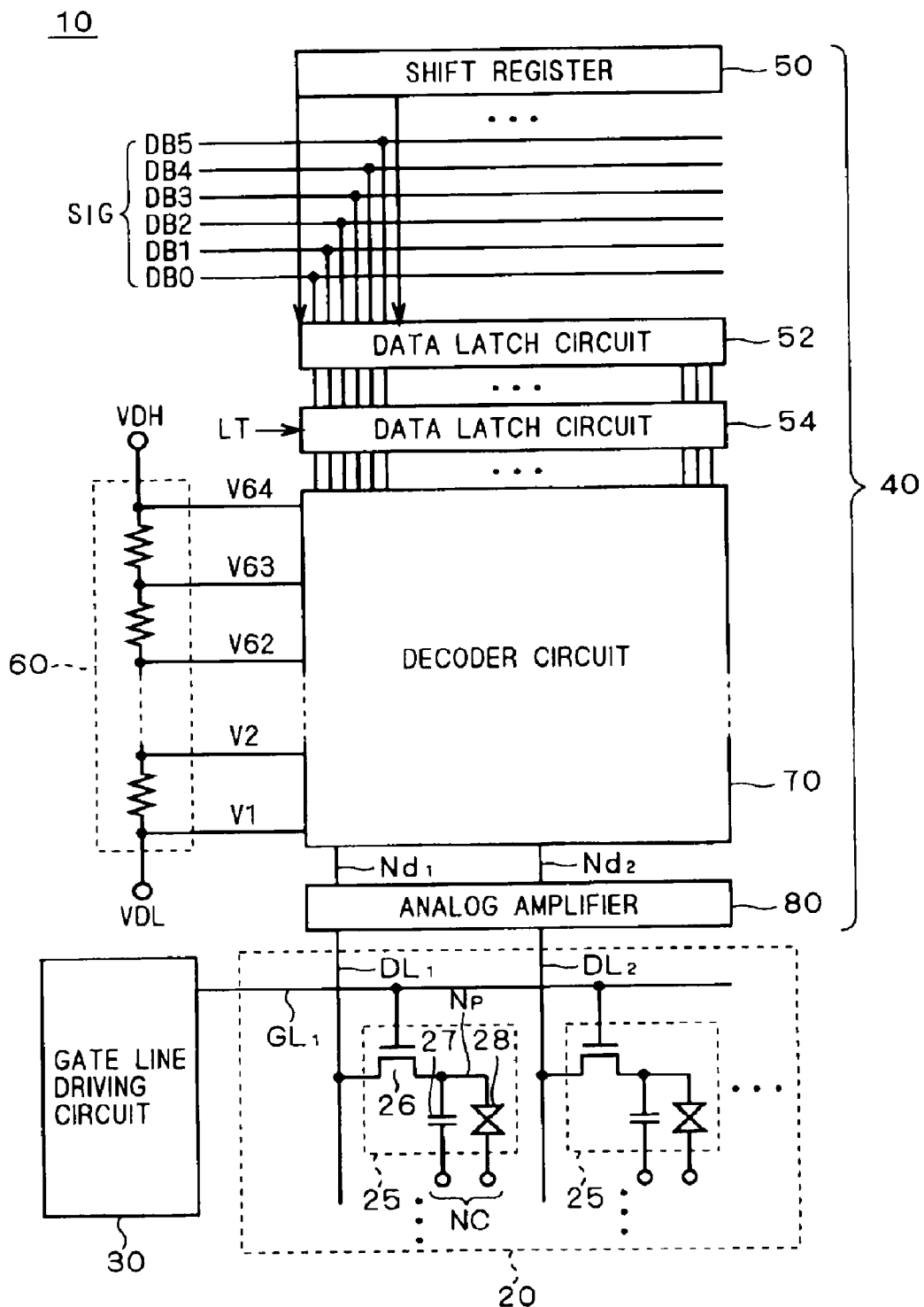
FIG. 1 is a schematic block diagram showing a configuration of a display apparatus according to preferred embodiments of the present invention.

Hereinbelow, preferred embodiments of the present invention will be described with reference to the accompanied drawings. To avoid repetition and redundancy of description, elements having the same or equivalent functions are designated by the same reference numerals or characters in the drawings.

First Preferred Embodiment

FIG. 1 is a schematic block diagram showing a configuration of a display apparatus according to a first preferred embodiment of the present invention. It shows an overall configuration of a liquid crystal display 10 as a representative example of the display apparatus.

The liquid crystal display 10 includes a liquid crystal array 20, a gate line driving circuit (scanning line driving circuit) 30, and a source driver 40. As will be clear from the following description, a shift register according to preferred embodiments of the present invention is mounted in the gate line driving circuit 30.

The liquid crystal array 20 includes a plurality of pixels 25 arranged in a matrix. Gate lines $GL_1$, $GL_2$, ... (hereinafter also referred to generically as "gate lines GL") each are provided for each row of pixels (hereinafter also referred to as a "pixel line"), and data lines $DL_1$, $DL_2$, ... (hereinafter also referred to generically as "data lines DL") each are provided for each column of pixels (hereinafter also referred to as a "pixel column"). FIG. 1 representatively shows the pixels 25 in the first and second columns of the first row and the corresponding gate line $GL_1$ and the corresponding data lines $DL_1$ and $DL_2$.

Each pixel 25 has a pixel switching element 26 provided between a corresponding data line DL and a pixel node Np, and a capacitor 27 and a liquid crystal display device 28 which are connected in parallel between the pixel node Np and a common electrode node NC. The orientation of the liquid crystal in the liquid crystal display device 28 varies with the voltage difference between the pixel node Np and the common electrode node NC, in response to which the display luminance of the liquid crystal display device 28 changes. This makes it possible to control the luminance of each pixel using a display voltage transmitted to the pixel node Np through a data line DL and the pixel switching element 26. Specifically, an intermediate luminance can be obtained by applying an intermediate of voltage difference between a voltage difference corresponding to the maximum luminance and a voltage difference corresponding to the minimum luminance to between the pixel node Np and the common electrode node NC. Therefore, gradations of luminance can be obtained by setting the above display voltages stepwise.

The gate line driving circuit 30 sequentially selects and drives the gate lines GL in a predetermined scanning cycle. The pixel switching elements 26 have their gate electrodes connected to their corresponding gate lines GL. While a certain gate line GL is selected, the pixel switching element 26 in each of the pixels which are connected to the selected gate line GL is conducting so that the pixel node Np is in connection with a corresponding data line DL. Then, a display voltage transmitted to the pixel node Np is held by the capacitor 27. In general, the pixel switching element 26 is a TFT which is formed on the same insulator substrate (such as a glass substrate and a resin substrate) as the liquid crystal display device 28 is formed.

The source driver 40 is provided to output display voltages which are set stepwise by a display signal SIG that is an N-bit digital signal, to the data lines DL. As an example, the display signal SIG shall be a 6-bit signal including display signals bits DB0 to DB5. With such a 6-bit display signal SIG, $2^{6=64}$ levels of gray can be displayed in each pixel. Further, by forming one color display unit using three pixels of R (Red), G (green), and B (Blue), a display of approximately 260 thousand colors can be achieved.

As shown in FIG. 1, the source driver 40 includes a shift register 50, data latch circuits 52 and 54, a gradation voltage generating circuit 60, a decoder circuit 70, and an analog amplifier 80.

For the display signal SIG, the display signal bits DB0 to DB5 corresponding to the display luminance of each of the pixels 25 are serially generated. Specifically, the display signal bits DB0 to DB5 at each point in time indicate the display luminance of any one pixel 25 in the liquid crystal array 20.

The shift register 50 instructs the data latch circuit 52 to fetch the display signal bits DB0 to DB5 with timing synchronized with a cycle in which the setting of the display signal SIG is switched. The data latch circuit 52 sequentially fetches the serially-generated display signals SIG to latch display signals SIG of one pixel line.

A latch signal LT inputted to the data latch circuit 54 is activated at a time when display signals SIG of one pixel line have been fetched by the data latch circuit 52. In response to this, the data latch circuit 54 fetches display signals SIG of one pixel line latched in the data latch circuit 52 at that time.

The gradation voltage generating circuit 60 is composed of sixty-three partial pressure resistances which are connected in series between a high voltage VDH and a low voltage VDL and which generate 64 levels of gradation voltages V1 to V64, respectively.

The decoder circuit 70 decodes display signals SIG latched in the data latch circuit 54, and based on the result of decoding, selects and outputs voltages out of the gradation voltages V1 to V64 to decoder output nodes $Nd_1$, $Nd_2$, . . . (hereinafter also referred to generically as "decoder output nodes Nd"), respectively.

Consequently, display voltages (any of the gradation voltages V1 to V64) corresponding to display signals SIG of one pixel line latched in the data latch circuit 54 are outputted to the decoder output nodes Nd simultaneously (in parallel). FIG. 1 representatively shows the decoder output nodes $Nd_1$ and $Nd_2$ corresponding to the data lines $DL_1$ and $DL_2$ of the first and second columns, respectively.

The analog amplifier 80 outputs analog voltages which correspond to the display voltages outputted to the decoder output nodes $Nd_1$, $Nd_2$, . . . from the decoder circuit 70 to the data lines $DL_1$, $DL_2$, . . . , respectively.

The source driver 40 repeatedly outputs display voltages of one pixel line corresponding to a series of display signals SIG in a predetermined scanning cycle, and the gate line driving circuit 30 sequentially drives the gate lines $GL_1$, $GL_2$, . . . in synchronization with that scanning cycle. Accordingly, image display based on the display signals SIG is provided on the liquid crystal array 20.

While FIG. 1 shows, by way of example, the liquid crystal display 10 with such a configuration that the gate line driving circuit 30 and the source driver 40 are integrally formed with the liquid crystal array 20, the gate line driving circuit 30 and the source driver 40 may be provided as external circuits of the liquid crystal array 20.

Figure 2:
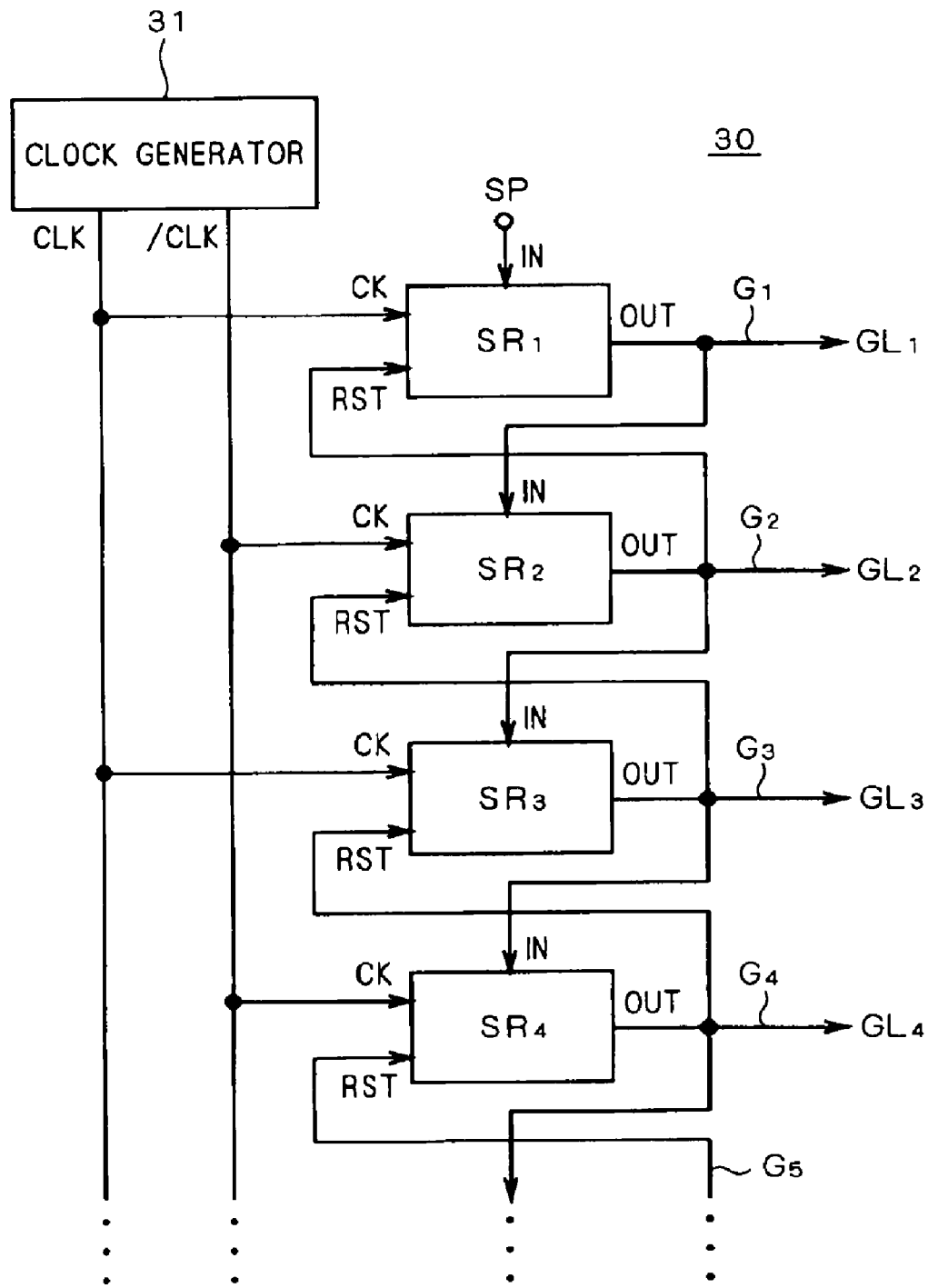
FIG. 2 is a block diagram showing a configuration of a conventional gate line driving circuit.

For ease of description of the present invention, the gate line driving circuit 30 using a conventional shift register will be described. FIG. 2 shows a configuration of a conventional gate line driving circuit 30. This gate line driving circuit 30 is constituted by a shift register including a plurality of cascade-connected unit shift registers $SR_1$, $SR_2$, $SR_3$, $SR_4$, . . . (hereinafter referred to generically as "unit shift registers SR"). Each unit shift register SR is provided for each pixel line, i.e., each gate line GL.

A clock generator 31 shown in FIG. 2 is provided to input two-phase clock signals CLK and /CLK having opposite phases to the unit shift registers SR in the gate line driving circuit 30. These clock signals CLK and /CLK are controlled to be activated alternately with timing synchronized with a scanning cycle of the display apparatus. That is, the clock signals CLK and /CLK are complementary to each other.

Each unit shift register SR has an input terminal IN, an output terminal OUT, a reset terminal RST, and a clock terminal CK. As shown in FIG. 2, either of the clock signals CLK and /CLK outputted from the clock generator 31 is supplied to the clock terminal CK of each unit shift register SR. The unit shift register SR has its output terminal OUT connected to a gate line GL. Specifically, signals $G_1$, $G_2$, $G_3$, . . . (hereinafter referred to generically as "output signals G") outputted from the output terminals OUT are horizontal (or vertical) scanning pulses for activating the gate lines GL.

A start pulse SP corresponding to the start of each frame period of an image signal is inputted to the input terminal IN of the unit shift register $SR_1$ of the first stage. To the input terminal IN of a unit shift register SR of the second or succeeding stage, the output signal G of the preceding stage is inputted. In other words, the input terminal IN of a unit shift register SR of the second or succeeding stage is connected to the output terminal OUT of the unit shift register SR of the preceding stage. Further, each unit shift register SR has its reset terminal RST connected to the output terminal OUT of a succeeding stage (the next stage in this example).

In the gate line driving circuit 30 with this configuration, in synchronization with the clock signal CLK or /CLK, each unit shift register SR transmits an input signal from the preceding stage (the output signal G of the preceding stage) to a corresponding gate line GL and to a unit shift register SR of the next stage while time-shifting the input signal (the operation of each unit shift register SR will be described later in detail). As a result, a series of unit shift registers SR serve as a so-called gate line driving unit for sequentially activating the gate lines GL with timing based on the predetermined scanning cycle.

FIG. 3 is a circuit diagram showing, by way of example, a configuration of a conventional unit shift register SR. In the gate line driving circuit 30, the cascade-connected unit shift registers SR have substantially the same configuration. Thus, a configuration of only one unit shift register SR will be described below as a representative example. Further, transistors in this unit shift register SR are all field-effect transistors of the same conductivity type, and they all shall be N-type TFTs herein. The N-type TFTs are active (ON) when their gates are HIGH, while inactive (OFF) when their gates are LOW. This is reversed for the P-type TFTs.

As shown in FIG. 3, the conventional unit shift register SR has a first power supply terminal S1 supplied with a low power supply potential VSS, in addition to the input terminal IN, the output terminal OUT, the reset terminal RST, and the clock terminal CK which are already shown in FIG. 2. In the following description, the low power supply potential VSS shall be a reference potential (=0V) of the circuit; however, in practical use, a reference potential is determined with reference to a voltage of data written into pixels, in which case the low power supply potential VSS may be set, for example, at −12 V.

In the conventional unit shift register SR shown in FIG. 3, a transistor Q1 is an output pull-up transistor supplying a clock signal inputted to the clock terminal CK to the output terminal OUT. A transistor Q2 is an output pull-down transistor supplying a potential (VSS) at the first power supply terminal S1 to the output terminal OUT to discharge the output terminal OUT. Herein, gate nodes of the transistors Q1 and Q2 are defined as "nodes N1 and N2," respectively.

A capacitive element C1 is provided between the gate and source of the transistor Q1, i.e., between the node N1 and the output terminal OUT. The capacitive element C1 is provided to enhance the effect of increasing the voltage at the node N1 with increasing potential level at the output terminal OUT.

A diode-connected transistor Q3, connected between the node N1 and the input terminal IN, is a charger transistor for charging the node N1. A transistor Q4 is connected between the node N1 and the first power supply terminal S1 and supplies a potential at the first power supply terminal S1 to the node N1 to discharge the node N1. The gate of the transistor Q4 is connected to the reset terminal RST. In the present example, the node N2 is also connected to the reset terminal RST.

The conventional gate line driving circuit 30 is configured such that a plurality of unit shift registers SR as shown in FIG. 3 are connected in cascade as shown in FIG. 2. Hereinbelow, the operation of a conventional unit shift register SR will be described, assuming that the unit shift register SR is used in the gate line driving circuit 30.

Figure 4:
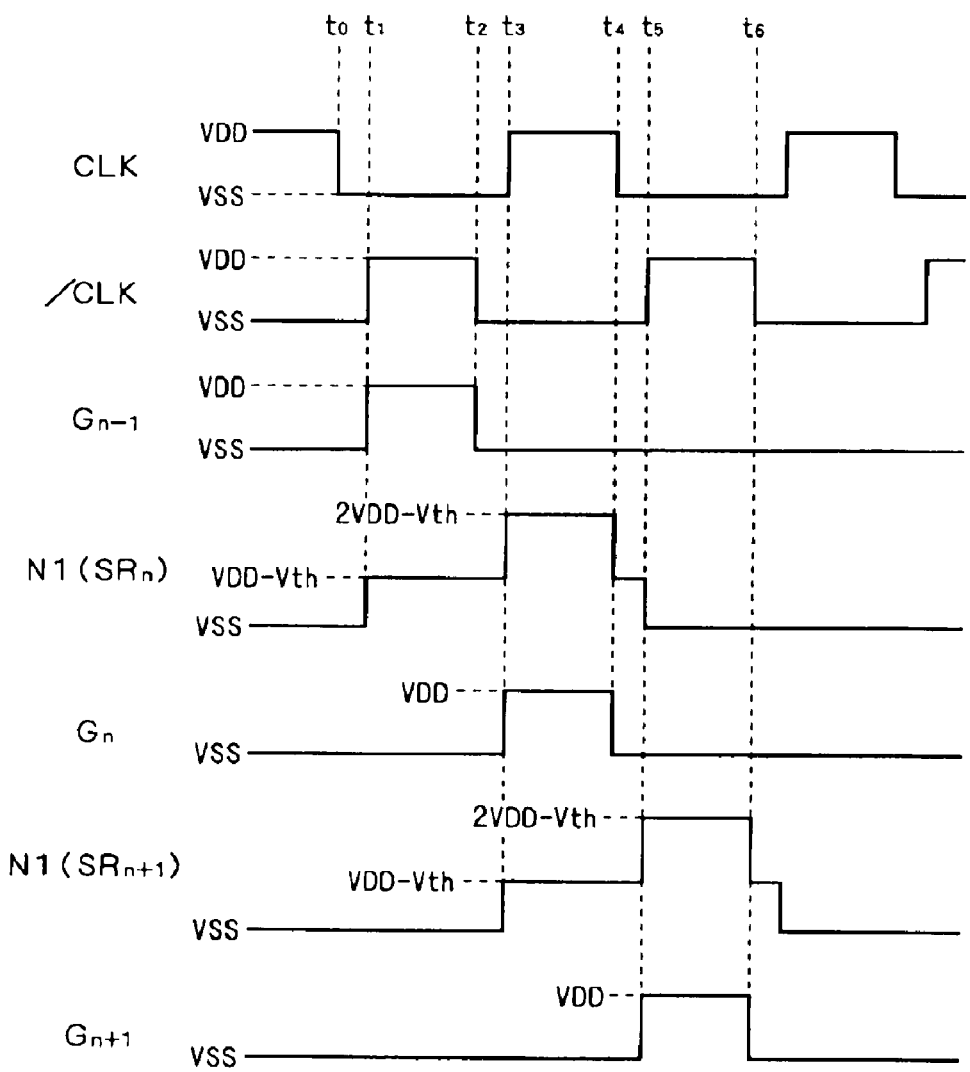
FIG. 4 is a timing chart illustrating the operations of conventional unit shift registers.

As described above, the unit shift registers SR included in the gate line driving circuit 30 have substantially the same configuration, so that the operation of a unit shift register $SR_n$ of the nth stage will be described herein as a representative example. FIG. 4 is a timing chart for explaining the operation of the unit shift register $SR_n$.

To simplify the description, the clock signal CLK shall be inputted to the clock terminal CK of the unit shift register $SR_n$. The output signal G from the output terminal OUT of a unit shift register $SR_i$ of the ith stage is designated by $G_i$. It is also assumed that the clock signals CLK and /CLK have the same high potential level, VDD (hereinafter, a "potential level" is referred to simply as a "level"), and that transistors forming each unit shift register SR all have the same threshold voltage, Vth.

Referring to FIG. 4, the initial state at time to is assumed to be such that the node N1 of the unit shift register $SR_n$ is at the low level (VSS) (the state where the node N1 is LOW is hereinafter referred to as a "reset state"). It is also assumed that an output signal $G_{n-1}$ of a unit shift register $SR_{n-1}$ of the preceding stage and an output signal $G_{n+1}$ of a unit shift register $SR_{n+1}$ of the next stage are both at the low level. In this case, the output terminal OUT of the unit shift register $SR_n$ is in a floating state since the transistors Q1 and Q2 thereof are both off; however, the output signal $G_n$ shall be at the LOW level in the initial state.

When the output signal $G_{n-1}$ of the preceding stage rises to the HIGH level at time $t_1$ when the clock signal /CLK transitions to the HIGH level, the transistor Q3 of the unit shift register $SR_n$ is turned on, and the node N1 thereof is charged to the HIGH level (VDD−Vth) (hereinafter, the state where the node N1 is HIGH is referred to as a "set state"). Thereby the transistor Q1 is turned on. However, since the clock signal CLK is LOW (VSS) at this time, the output signal $G_n$ remains at the LOW level.

When the clock signal /CLK falls at time $t_2$, the output signal $G_{n-1}$ of the preceding stage also falls to the LOW level. However, the level of the node N1 remains HIGH (VDD−Vth) in a floating state because the transistor Q3 is turned off and the transistor Q4 remains off.

When the clock signal CLK rises at time $t_3$, the level at the output terminal OUT (the output signal $G_n$) starts to rise because, at this time, the transistor Q1 is on and the transistor Q2 is off. This causes the voltage at the node N1 to rise due to coupling through the gate-channel capacitance of the transistor Q1 and the capacitive element C1. Accordingly, the transistor Q1 operates in the nonsaturated region, and the output signal $G_n$ rises to the HIGH level (VDD) with no loss of the threshold voltage Vth of the transistor Q1. Consequently, the level of the node N1 rises to almost 2×VDD−Vth.

When the output signal $G_n$ becomes HIGH, it is inputted to the input terminal IN of the unit shift register $SR_{n+1}$ of the next stage, whereby the transistor Q3 of the unit shift register $SR_{n+1}$ is turned on. At time $t_3$, therefore, the node N1 of the unit shift register $SR_{n+1}$ is charged to VDD−Vth.

When the clock signal CLK falls at time $t_4$, the output signal $G_n$ of the unit shift register $SR_n$ also falls to a lower level. At this time, the level of the node N1 also falls to VDD−Vth due to coupling through the capacitive element C1 and the gate-channel capacitance of the transistor Q1. However even in that case, the transistor Q1 remains on, so that the output signal $G_n$ falls to the LOW level, VSS, following the clock signal CLK.

When the clock signal /CLK rises at time $t_5$, then, the voltage at the node N1 of the unit shift register $SR_{n+1}$ of the next stage rises and the output signal $G_{n+1}$ becomes HIGH (VDD). This brings the reset terminal RST of the unit shift register $SR_n$ to the HIGH level. Accordingly, the transistor Q4 is turned on, whereby the node N1 is discharged to the LOW level and the transistor Q1 is turned off. That is, the unit shift register $SR_n$ returns to its reset state. Since the reset terminal RST is connected also to the gate of the transistor Q2 (the node N2), the transistor Q2 is turned on and the output signal $G_n$ becomes VSS with reliability.

When the clock signal /CLK falls to the LOW level at time $t_6$, the output signal $G_{n+1}$ of the next stage becomes LOW and correspondingly the reset terminal RST of the unit shift register $SR_n$ becomes LOW. As a result, the transistors Q2 and Q4 are turned off, and the unit shift register $SR_n$ returns to the aforementioned initial state (the state at time $t_0$).

In summary of the aforementioned operation, the unit shift register $SR_n$ is in the reset state where the node N1 is LOW, during a time interval that a signal (the output signal $G_{n-1}$ of the preceding stage, or the start pulse SP) is not inputted to the input terminal IN. Since the transistor Q1 is off in the reset state, the output signal $G_n$ remains at the LOW level irrespective of the level of the clock signal CLK. Upon signal input to the input terminal IN, the unit shift register $SR_n$ is brought into the set state where the node N1 is HIGH. In the set state, since the transistor Q1 is on and the transistor Q2 is off, the output signal $G_n$ is outputted in response to the clock signal CLK rising to the HIGH level. After that, upon input of a signal (the output signal $G_{n+1}$ of the next stage) to the reset terminal RST, the unit shift register $SR_n$ returns to its reset state, in which state the transistor Q1 is turned off and thus the output signal $G_n$ remains at the LOW level.

In a multi-stage shift register (the gate line driving circuit 30) in which a plurality of unit shift registers SR operating in the aforementioned manner are connected in cascade as shown in FIG. 2, an input of the start pulse SP to the unit shift register $SR_1$ of the first stage initiates sequential transmission of the output signals G to the unit shift registers $SR_2$, $SR_3$, ... while shifting those signals with timing synchronized with the clock signal CLK or /CLK. Thereby, the gate line driving circuit 30 can sequentially drive the gate lines $GL_1$, $GL_2$, $GL_3$, ... in a predetermined scanning cycle.

Figure 5:
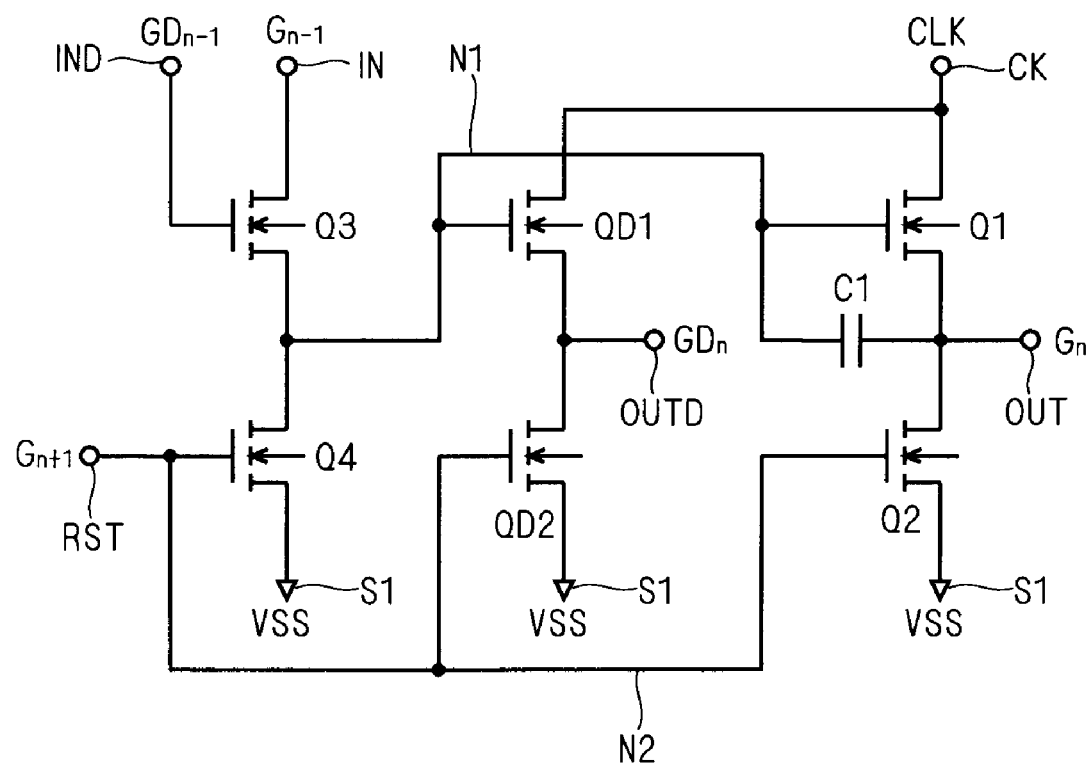
FIG. 5 is a circuit diagram showing a configuration of a unit shift register according to a first preferred embodiment.

Hereinbelow, a shift register circuit according to the present invention will be described, which can operate at higher speed than the conventional shift register circuit as shown in FIG. 3. FIG. 5 is a circuit diagram showing a configuration of a unit shift register SR according to the first preferred embodiment of the present invention. As shown, the unit shift register SR has two (first and second) input terminals IN and IND and two (first and second) output terminals OUT and OUTD. Like the unit shift register SR of FIG. 3, this unit shift register SR also has the clock terminal CLK, the reset terminal RST, and the first power supply terminal S1.

In this preferred embodiment, transistors included in the unit shift register SR are all field-effect transistors of the same conductivity type, and they all shall be N-type TFTs herein. The N-type TFTs are active (ON) when their gates are HIGH, while inactive (OFF) when their gates are LOW. This is reversed for the P-type TFTs.

As shown in FIG. 5, the first output terminal OUT is connected to transistors Q1 and Q2. The transistor Q1, connected between the first output terminal OUT and the clock terminal CLK, is an output pull-up transistor (first transistor) that supplies a clock signal inputted at the clock terminal CK to the first output terminal OUT. The transistor Q2, connected between the first output terminal OUT and the first power supply terminal S1, is an output pull-down transistor (second transistor) that supplies a potential (VSS) at the first power supply terminal S1 to the first output terminal OUT to discharge the first output terminal OUT.

The second output terminal OUTD is connected to transistors QD1 and QD2. The transistor QD1, connected between the second output terminal OUTD and the clock terminal CK, is an output pull-up transistor (third transistor) that supplies a clock signal inputted at the clock terminal CK to the second output terminal OUTD. The transistor QD2, connected between the second output terminal OUTD and the first power supply terminal S1, is an output pull-down transistor (fourth transistor) that supplies a potential at the first power supply terminal S1 to the second output terminal OUTD to discharge the second output terminal OUTD.

The transistors Q1 and Q2 connected to the first output terminal OUT, and the transistors QD1 and QD2 connected to the second output terminal OUTD are in parallel connection. The gates (control electrodes) of the transistors Q1 and QD1 are connected to each other, and the gates of the transistors Q2 and QD2 are connected to each other. As shown in FIG. 5, a node (first node) that connects the gates of the transistors Q1 and QD1 is defined as a "node N1," and a node (second node) that connects the gates of the transistors Q2 and QD2 is defined as a "node N2."

The unit shift register SR of FIG. 5, like the circuit shown in FIG. 3, has a capacitive element C1 provided between the gate and source of the transistor Q1, i.e., between the node N1 and the first output terminal OUT. This capacitive element C1 is provided to enhance the effect of increasing the voltage at the node N1 with increasing level at the first output terminal OUT. However, the capacitive element C1 may be replaced with a sufficiently large gate-channel capacitance of the transistor Q1, in which case the capacitive element C1 may be omitted.

The node N1 is connected to transistors Q3 and Q4. The transistor Q3 (fifth transistor) is connected between the node N1 and the first input terminal IN and has its gate connected to the second input terminal IND. The transistor Q4 (sixth transistor) is connected between the node N1 and the first power supply terminal S1 and supplies a potential at the first power supply terminal S1 to the node N1 to discharge the node N1. The gate of the transistor Q4 is connected to the reset terminal RST. In this preferred embodiment, the node N2 is also connected to the reset terminal RST.

FIG. 6 is a block diagram showing a configuration of the gate line driving circuit 30 using the unit shift registers SR according to the first preferred embodiment. In this preferred embodiment, also, the gate line driving circuit 30 is constituted by a shift register including a plurality of unit shift registers $SR_1$, $SR_2$, $SR_3$, $SR_4$, ... which are connected in cascade. A clock generator 31 shown in FIG. 6 is equivalent to that shown in FIG. 2 and is configured to output the clock signals CLK and /CLK which are complementary to each other. The clock terminal CLK of each unit shift register SR is supplied with either of the clock signals CLK and /CLK outputted from the clock generator 31.

While the unit shift registers SR according to this preferred embodiment each have the two input terminals IN and IND, the input terminals IN and IND of the unit shift register $SR_1$ of the first stage both receive the start pulse SP. The unit shift registers SR of the second and succeeding stages each have its first input terminal IN connected to the first output terminal OUT of the preceding stage and its second input terminal IND connected to the second output terminal OUTD of the preceding stage.

While the unit shift registers SR according to this preferred embodiment each have the two output terminals OUT and OUTD, the gate lines GL of the display panel are connected to the first output terminals OUT. Specifically, the output signals $G_1$, $G_2$, $G_3$, ... (hereinafter referred to generically as "first output signals G") from the first output terminals OUT are horizontal (or vertical) scanning pulses for activating the gate lines GL. The first output terminal OUT of each unit shift register SR is further connected to the reset terminal RST of the preceding stage and to the first input terminal IN of the next stage. On the other hand, the second output terminals OUTD outputting the output signals $GD_1$, $GD_2$, $GD_3$, ... (hereinafter referred to generically as "second output signals GD") are not connected to the gate lines GL, but each are connected to the second input terminal IND of the next stage.

In the gate line driving circuit 30 with this configuration, also each unit shift register SR transmits signals inputted from the preceding stage (the first and second output signals G and GD of the preceding stage) to a corresponding gate line GL and to a unit shift register SR of the next stage while time-shifting those signals in synchronization with the clock signal CLK or /CLK. Hereinbelow, the operation of a unit shift register SR included in the gate line driving circuit 30 will be described.

Figure 7:
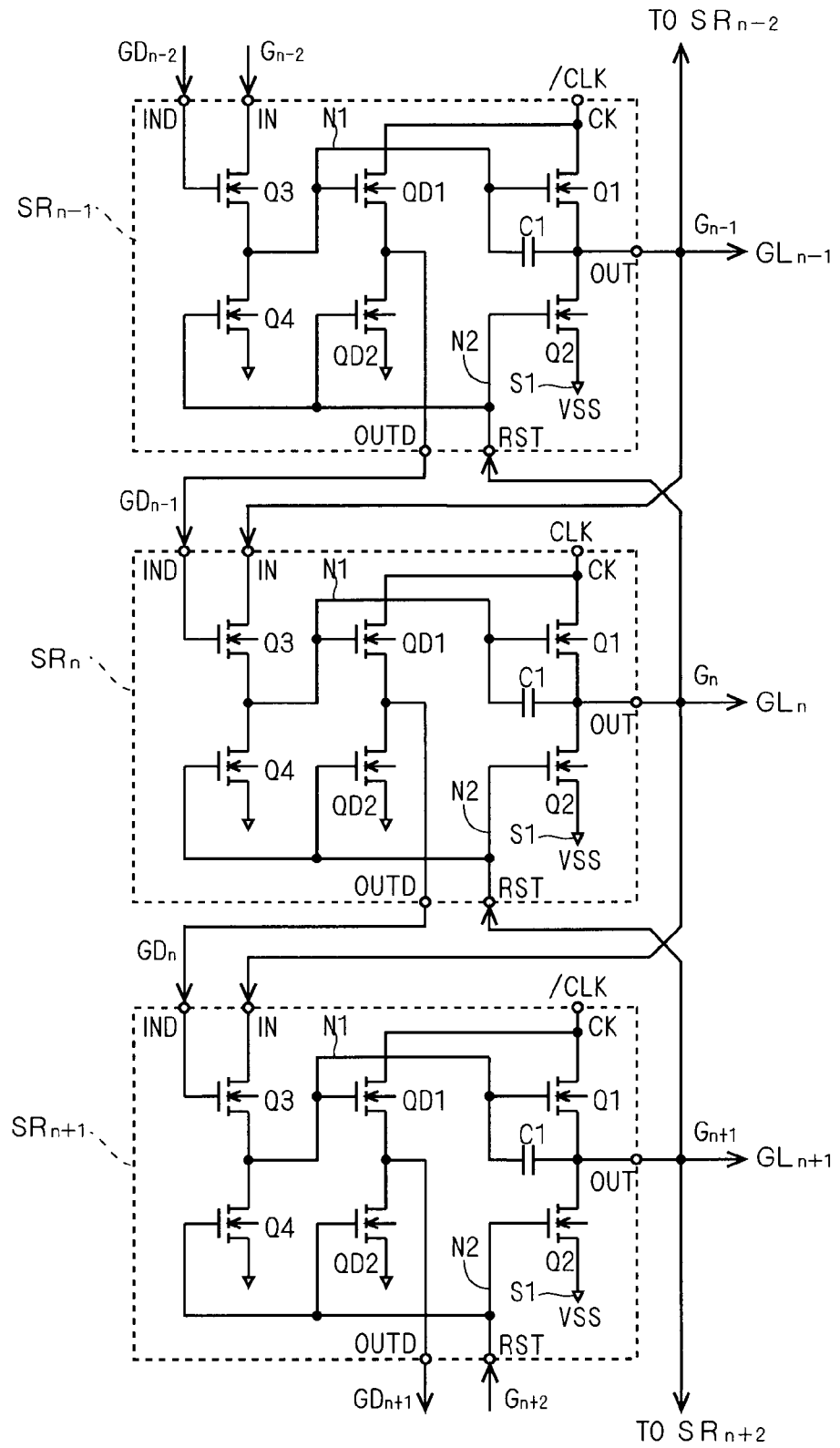
FIG. 7 is a circuit diagram showing the configuration of the gate line driving circuit according to the first preferred embodiment.
Figure 8:
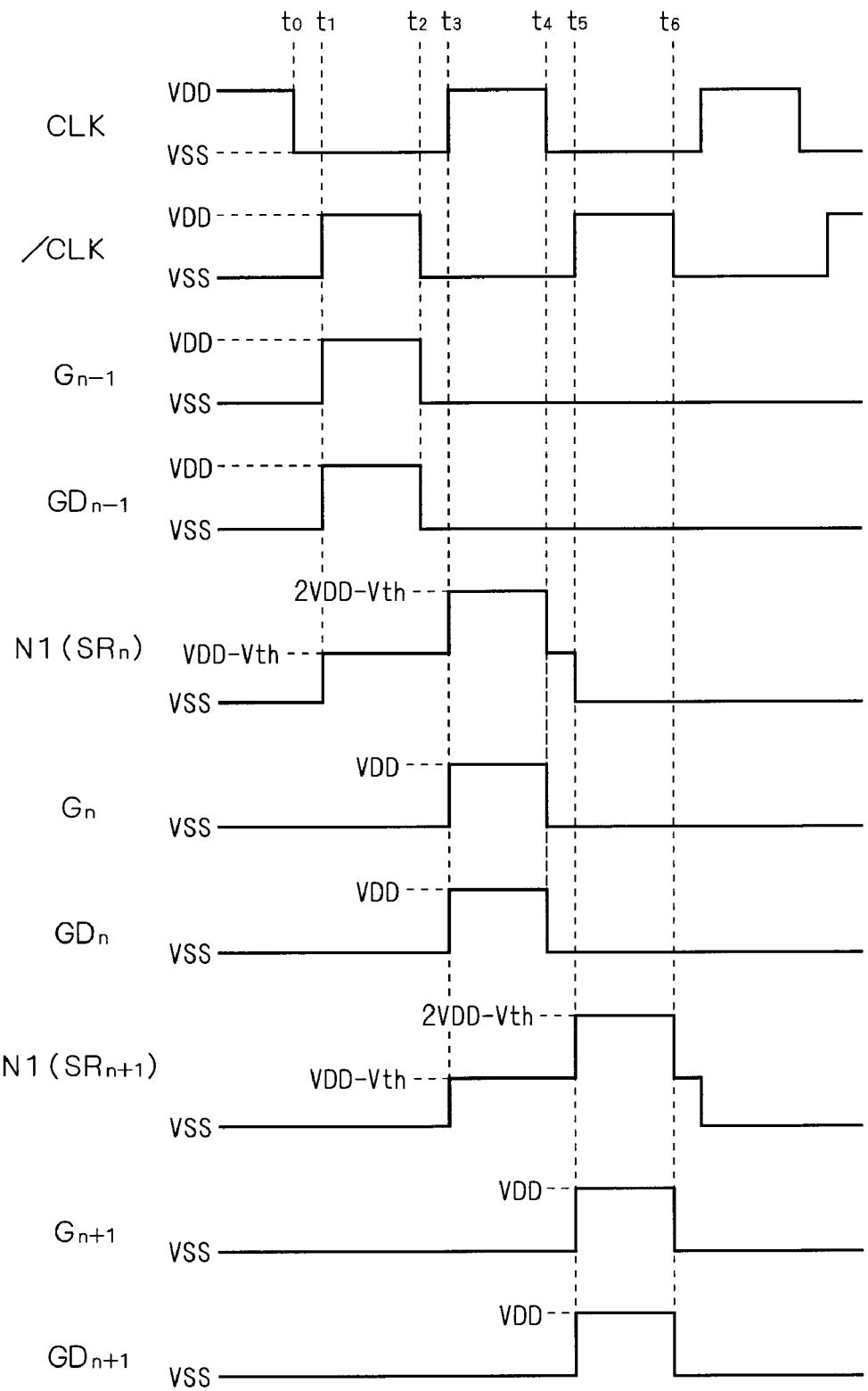
FIG. 8 is a timing chart illustrating the operations of unit shift registers according to the first preferred embodiment.

Herein, also, the operation of a unit shift register $SR_n$ of the nth stage will be described as a representative example. FIG. 7 is a circuit diagram illustrating the connection relationship among the unit shift register $SR_n$ of the nth stage, the unit shift register $SR_{n-1}$ of the preceding stage (the (n−1)th stage), and the unit shift register $SR_{n+1}$ of the next stage (the (n+1)th stage). FIG. 8 is a timing chart for explaining the operation of the unit shift register $SR_n$. Hereinbelow, referring to FIGS. 7 and 8, the operation of the unit shift register SR shown in FIG. 5 and according to this preferred embodiment will be described.

For ease of description, the following description is given on the assumption that the clock signal CLK is inputted to the clock terminal CK of the unit shift register $SR_n$, and the clock signal /CLK is inputted to the clock terminals CK of the unit shift registers $SR_{n-1}$ and $SR_{n+1}$. The first output signal G from the first output terminal OUT of a unit shift register $SR_i$ of the ith stage is designated by $G_i$, and the second output signal GD from the second output terminal OUTD of the unit shift register $SR_i$ is designated by $GD_i$. It is also assumed that the clock signals CLK and /CLK have the same HIGH level, VDD, and that transistors included in each unit shift register SR all have the same threshold voltage, Vth.

Referring to FIG. 8, the initial state at time to is assumed to be such that the node N1 of the unit shift register $SR_n$ is at the low level (VSS) (the state where the node N1 is LOW is hereinafter referred to as a "reset state"). It is also assumed that the first and second output signals $G_{n-1}$ and $GD_{n-1}$ of the unit shift register $SR_{n-1}$ and the first and second output signals $G_{+1}$ and $GD_{n+1}$ of the unit shift register $SR_{n+1}$ are all at the LOW level. In this case, the first and second output terminals OUT and OUTD of the unit shift register $SR_n$ are in a floating state since the transistors Q1, Q2, QD1, and QD2 thereof are all off, however, the first and second output signals $G_n$ and $GD_n$ shall be at the LOW level in the initial state.

If the first and second output signals $G_{n-1}$ and $GD_{n-1}$ of the preceding stage rise to the HIGH level at time $t_1$ when the clock signal /CLK transitions to the HIGH level, the transistor Q3 of the unit shift register $SR_n$ is turned on, and the node N1 thereof is charged to the HIGH level (VDD–Vth) (hereinafter, the state where the node N1 is HIGH is referred to as a "set state"). Thereby the transistors Q1 and QD1 are turned on. However, since the clock signal CLK is LOW (VSS) at this time, the output signal $G_n$ remains at the LOW level.

When the clock signal /CLK falls at time $t_2$, the output signals $G_{n-1}$ and $GD_{n-1}$ of the preceding stage also fall to the LOW level. However, the node N1 remains HIGH (VDD–Vth) in a floating state because the transistor Q3 is turned off and the transistor Q4 remains off.

When the clock signal CLK rises at time $t_3$, the levels at the first and second output terminals OUT and OUTD (the first and second output signals $G_n$ and $GD_n$) start to rise because, at this time, the transistors Q1 and QD1 are on and the transistors Q2 and QD2 are off. This causes the voltage at the node N1 to rise due to coupling through the gate-channel capacitances of the transistors Q1 and QD1 and the capacitive element C1. Accordingly, the transistors Q1 and QD1 operate in the nonsaturated region, and the first and second output signals $G_n$ and $GD_n$ rise to the HIGH level (VDD) with no loss of the threshold voltage Vth of the transistors Q1 and QD1. Consequently, the level of the node N1 rises to almost 2×VDD−Vth.

When the first and second output signals $G_n$ and $GD_n$ become HIGH, they are inputted to the first and second input terminals IN and IND of the unit shift register $SR_{n+1}$ of the next stage, so that the transistor Q3 of the unit shift register $SR_{n+1}$ is turned on. At time $t_3$, therefore, the node N1 of the unit shift register $SR_{n+1}$ is charged to VDD–Vth.

When the clock signal CLK falls at time $t_4$, the first and second output signals $G_n$ and $GD_n$ of the unit shift register $SR_n$ also fall to a lower level. At this time, the level of the node N1 also falls to VDD–Vth due to coupling through the gate-channel capacitances of the transistors Q1 and QD1 and the capacitive element C1. However even in that case, the transistors Q1 and QD1 remain ON, so that the first and second output signals $G_n$ and $GD_n$ fall to the LOW level, VSS, following the clock signal CLK.

When the clock signal /CLK rises at time $t_5$, then, the voltage at the node N1 of the unit shift register $SR_{n+1}$ of the next stage is boosted and the first and second output signals $G_{n+1}$ and $GD_{n+1}$ become HIGH (VDD). This brings the reset terminal RST of the unit shift register $SR_n$ to the HIGH level.

Accordingly, the transistor Q4 is turned on, so that the node N1 is discharged to the LOW level and the transistors Q1 and QD1 are turned off. That is, the unit shift register $SR_n$ returns to its reset state. Since the reset terminal RST is connected also to the gates of the transistors Q2 and QD2 (the node N2), the transistors Q2 and QD2 are turned on and the first and second output signals $G_n$ and $GD_n$ become VSS with reliability.

When the clock signal /CLK falls to the LOW level at time $t_6$, the first and second output signals $G_{n+1}$ and $GD_{n+1}$ of the next stage become LOW and correspondingly the reset terminal RST of the unit shift register $SR_n$ becomes LOW. As a result, the transistors Q2, QD2, Q4, and QD4 are turned off, and the unit shift register $SR_n$ returns to the aforementioned initial state (the state at time to).

In summary of the aforementioned operation, the unit shift register $SR_n$ according to this preferred embodiment is in the reset state where the node N1 is LOW, during a time interval that signals (the first and second output signals $G_{n-1}$ and $GD_{n-1}$ of the preceding stage, or the start pulse SP) are not inputted to the first and second input terminals IN and IND. Since the transistors Q1 and QD1 are off in the reset state, the first and second output signal $G_n$ and $GD_n$ remain at the LOW level irrespective of the level of the clock signal CLK. Upon signal input to the first and second input terminals IN and IND, the unit shift register $SR_n$ is brought into the set state where the node N1 is HIGH. In the set state, since the transistors Q1 and QD1 are on and the transistors Q2 and QD2 are off, the first and second output signals $G_n$ and $GD_n$ are outputted in response to the clock signal CLK rising to the HIGH level. After that, upon input of a signal (the first output signals $G_{n+1}$ of the next stage) to the reset terminal RST, the unit shift register $SR_n$ returns to its reset state, in which state the first and second output signals $G_n$ and $GD_n$ remain at the LOW level.

In a multi-stage shift register (the gate line driving circuit 30) in which a plurality of unit shift registers SR operating in the aforementioned manner are connected in cascade as shown in FIGS. 6 and 7, an input of the start pulse SP to the unit shift register $SR_1$ of the first stage initiates sequential transmission of the first and second output signals G and GD to the unit shift registers $SR_2$, $SR_3$, . . . while shifting those output signals with timing synchronized with the clock signal CLK or /CLK. Thereby, the gate line driving circuit 30 can sequentially drive the gate lines $GL_1$, $GL_2$, $GL_3$, . . . in a predetermined scanning cycle.

As described above, in each shift register circuit SR according to this preferred embodiment, the transistors Q1 and Q2 connected to the first output terminal OUT, and the transistors QD1 and QD2 connected to the second output terminal OUTD are in parallel connection. Thus, the levels of the first and second output signals $G_n$ and $GD_n$ logically transition in the same manner as shown in FIG. 8. Accordingly, the logical operation of the gate line driving circuit 30 is unchanged from that of the conventional unit shift registers (see FIGS. 3 and 4). However, the unit shift registers SR according to this preferred embodiment can achieve the effects described below.

Figure 9:
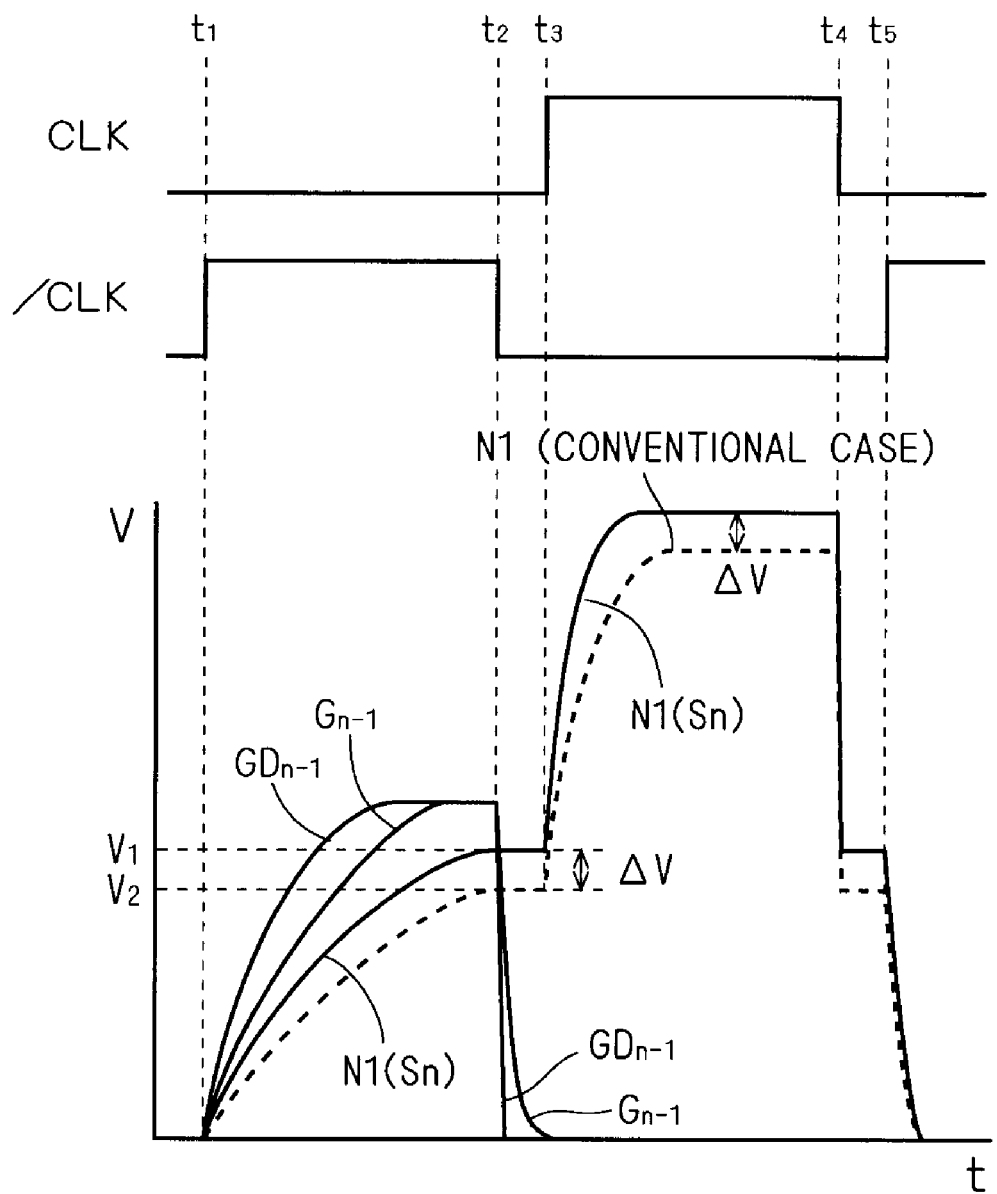
FIG. 9 is a diagram for explaining the effect of the unit shift registers according to the first preferred embodiment.

FIG. 9 is a diagram for explaining the effects of the present invention. It shows voltage waveforms at the node N1 of one unit shift register SR during charge (precharge) and during voltage rise. The times $t_1$ to $t_5$ shown in the figure are equivalent to those shown in FIG. 8.

In the gate line driving circuit 30 according to this preferred embodiment, the first output terminal OUT of each unit shift register SR is connected to the reset terminal RST of the preceding stage, the first input terminal IN of the next stage, and a gate line GL which can be a large capacitive load. On the other hand, the second output terminal OUTD is connected only to the second input terminal IND of the next stage, so that its value of load capacity is some orders of magnitude less than that of the first output terminal OUT. Accordingly, the second output signal GD of each unit shift register SR can rise faster than the first output signal G thereof.

Referring again to the unit shift register $SR_n$ of the nth stage, when the clock /CLK rises at time $t_1$, the second output signal $GD_{n-1}$ of the preceding stage rises faster than the first output signal $G_{n-1}$ thereof as shown in FIG. 9. As shown in FIG. 7, the first output signal $G_{n-1}$ is inputted to the drain (the first input terminal IN) of the transistor Q3 that charges the node N1 of the unit shift register $SR_n$, and the second output signal $GD_{n-1}$ is inputted to the gate (the second input terminal IND) of the transistor Q3 of the unit shift register $SR_n$. Thus, with rises in the levels of the first and second output signals $G_{n-1}$ and $GD_{n-1}$ of the preceding stage, the transistor Q3 of the unit shift register $SR_n$ is turned on and the node N1 is charged to a higher level as indicated by the solid line in FIG. 9.

At this time, since the second output signal $GD_{n-1}$ of the preceding stage rises faster than the first output signal $G_{n-1}$ thereof, the gate potential of the transistor Q3 in the early stage in the process of charging the node N1 becomes sufficiently higher than the drain potential thereof. Accordingly, the transistor Q3 operates in the nonsaturated region, and the level of the node N1 rises to almost the same level as the first output signal $G_{n-1}$.

Following a subsequent rise in the level of the node N1, the transistor Q3 starts to transition to operate in the saturated region. Besides, a delayed rise in the level of the node N1 due to a time constant based on a parasitic capacitance associated with the node N1 gradually increases a difference between the level of the node N1 and the level of the first output signal $G_{n-1}$ of the preceding stage. At the final stage in the process of charging the node N1, the transistor Q3 operates completely in the saturated region, so the difference in level is further increased.

When the clock signal /CLK falls at time $t_2$, the level of the node N1 stops rising at a level (a level V1 shown in FIG. 9) that is somewhat lower than the HIGH level (VDD) of the first output signal $G_{n-1}$ of the preceding stage. At time t2, since there is a difference in the value of load capacity between the first and second output terminals OUT and OUTD of the unit shift register $SR_{n-1}$ of the preceding stage, the first output signal $G_{n-1}$ falls to a lower level slower than the second output signal $GD_{n-1}$.

Then, when the clock signal CLK rises at time $t_3$, the level of the node N1 rises due to capacitive coupling through the gate-channel capacitances of the transistors Q1 and QD1 and the capacitive element C1. The raised level of the node N1 is maintained until time t4 when the clock signal CLK falls. Maintaining the node N1 at a sufficiently high level during the time interval between $t_3$ and $t_4$ makes it possible to keep high drive capabilities of the transistors Q1 and QD2 when the unit shift register $SR_n$ outputs the first and second output signals $G_n$ and $GD_n$. This allows high-speed rising and falling of the first and second output signals $G_n$ and $GD_n$.

On the other hand, the curve indicated by the broken line in FIG. 9 shows changes in the level of the node N1 in the conventional unit shift register SR (FIG. 3). In the conventional unit shift register SR, the transistor Q3 is diode-connected so that the drain and gate thereof are connected to each other. The transistor Q3 thus operates always in the saturated region. Accordingly, from the early stage in the process of charging the node N1, the level of the node N1 is lower than that of the output signal $G_{n-1}$ of the preceding stage by the threshold voltage Vth of the transistor Q3. Besides, since the transistor Q3 operates in a source-follower mode from the early stage in the process of charging the node N1, the charging speed is not fast. Therefore, as shown by the curve indicated by the broken line in FIG. 9, the level of the node N1 can rise only to a level V2 that is lower than the above level V1 at time $t_3$.

Assuming that a potential difference between the levels V1 and V2 is $\Delta V$, this potential difference $\Delta V$ is maintained even at time $t_4$ when the voltage at the node N1 rises. That is, the unit shift register SR according to this preferred embodiment can increase the level of the node N1 during the time interval between $t_3$ and $t_4$ by $\Delta V$ as compared to the conventional unit shift register SR. Hence, the rising and falling speeds of the first and second output signals $G_n$ and $GD_n$ are faster than those of the output signal in the conventional unit shift register SR. Accordingly, the shift register according to this preferred embodiment can operate at higher speed than the conventional shift register.

The aforementioned effect is achieved by high-speed rising of the second output signal GD inputted to the gate (the second input terminal IND) of the transistor Q3 in each of the cascade-connected unit shift registers SR. As the rising speed increases, the effect becomes more remarkable. Thus, the capacitive load on the second output terminal OUTD should preferably be as small as possible.

According to this preferred embodiment, as shown in FIGS. 6 and 7, each unit shift register SR is configured such that its first output signal G is supplied to the reset terminal RST of the preceding stage, to the first input terminal IN of the next stage, and to a gate line GL, and its second output signal GD is supplied only to the second input terminal IND of the next stage. However, since the first and second output signals G and GD have almost the same waveform as shown in FIG. 8, for example the second output signal GD may be supplied to the reset terminal RST of the preceding stage. That is, each unit shift register SR may be configured to have its first output terminal OUT connected to the first input terminal IN of the next stage and to a gate line GL, and its second output terminal OUTD connected to the reset terminal RST of the preceding stage and the second input terminal IND of the next stage.

However, it should be noted that doing so increases the capacitive load on the second output terminal OUTD by the gate capacitances of the transistors Q2 and Q4 in the unit shift register SR of the preceding stage and thus reduces the falling speed of the second output signal GD as compared to that in the case of FIGS. 6 and 7, thereby somewhat lessening the effect of the present invention.

Further, it is, for example, also possible to supply the second output signal GD of each unit shift register SR to the first input terminal IN of the next stage for operation. In that case, however, the gate capacitances of the transistors Q1 and QD1 of the next stage and the capacitive element C1 of the next stage are applied as loads to the second output terminal OUTD through the transistor Q3 of the next stage, so that the capacitive load on the second output terminal OUTD increases by that amount. Especially, the transistor Q1 for use in charging the gate lines GL is set to have a large channel width and thus has especially a large gate capacitance, the rising speed of the second output signal GD slows down, which lessens the effect of the present invention. To prevent this, the drive capability of the transistor QD1 should be improved so that the gate capacitance of the transistor Q1 of the next stage can be charged at high speed using the second output signal OUTD. For this to be achieved, however, the channel width of the transistor QD1 needs to be increased, which is not preferable because of accompanied increase in the area of the circuit.

In the foregoing description, there is a certain time interval between the HIGH level period of the clock signal CLK and the HIGH level period of the clock signal /CLK, this time interval may be omitted. That is, such a two-phase clock may be used that the clock signal /CLK falls simultaneously with the rise of the clock signal CLK, and the clock signal /CLK rises simultaneously with the fall of the clock signal CLK.

Further, the unit shift registers SR according to this preferred embodiment may operate using a three-phase clock, like the conventional shift register (for example, see FIG. 4 of Japanese Patent Application Laid-open No. 8-87897). In that case, the reset terminal RST of each unit shift register SR may receive the second output signal GD of the stage after next, in which case also the same effect as described above can be achieved.

Second Preferred Embodiment

Figure 10:
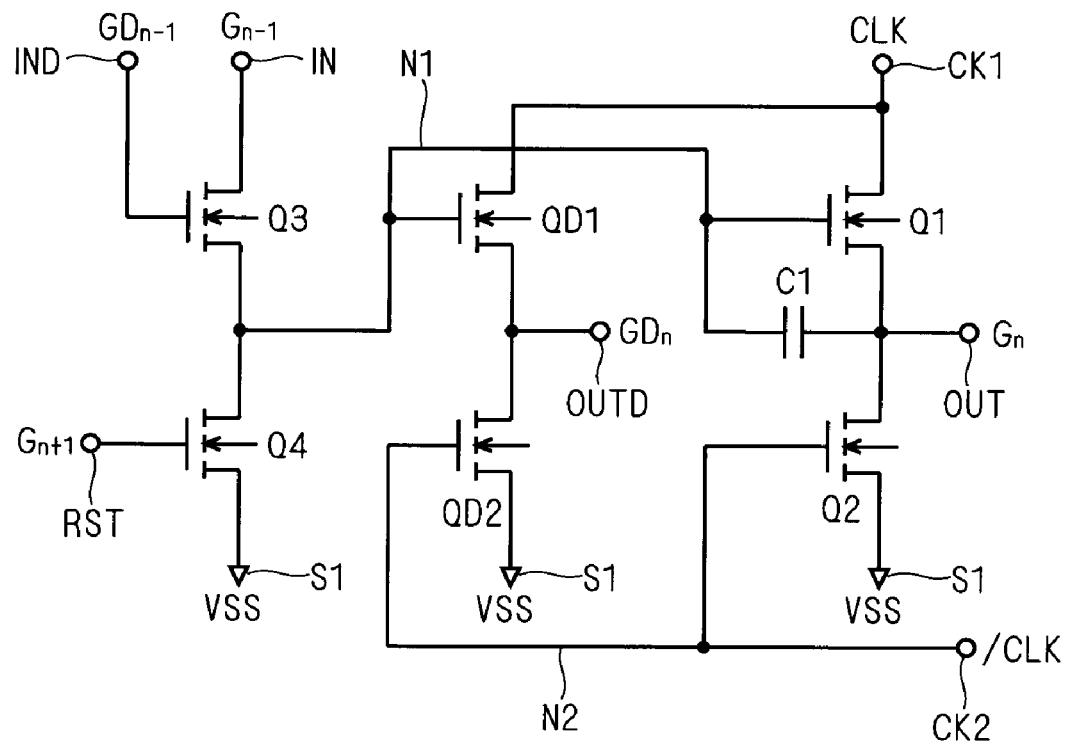
FIG. 10 is a circuit diagram showing a configuration of a unit shift register according to a second preferred embodiment.

FIG. 10 is a circuit diagram showing a configuration of a unit shift register SR according to a second preferred embodiment of the present invention. In this figure, elements having similar functions to those shown in FIG. 5 are designated by the same reference numerals or characters.

While the unit shift registers SR (FIG. 5) according to the first preferred embodiment each have one clock terminal CK, the unit shift registers SR according to the second preferred embodiment each have two clock terminals CK1 and CK2 as shown in FIG. 10. Hereinafter, the clock terminal CK1 is referred to as a "first clock terminal," and the clock terminal CK2 as a "second clock terminal."

The first clock terminal CK1 is equivalent to the clock terminal CK of the unit shift register SR shown in FIG. 5. That is, in this preferred embodiment, a clock signal inputted to the first clock terminal CK1 is supplied to the first and second output terminals OUT and OUTD through the transistors Q1 and QD1, respectively, to activate the first and second output signals G and GD.

On the other hand, the second clock terminal CK2 receives a clock signal having a different phase from that inputted to the first clock terminal CK1. For example, in the unit shift register SR in which the clock signal CLK is inputted to the first clock terminal CK1, the clock signal /CLK is inputted to the second clock terminal CK2. The second clock terminal CK2 is connected to the gates of the transistors Q2 and QD2 (the node N2). The gate of the transistor Q4 is connected to the reset terminal RST as in the first preferred embodiment.

Herein, also, the unit shift register $SR_n$ of the nth stage will be described as a representative example, assuming that the clock signal CLK is inputted to the first clock terminal CK1 and the clock signal /CLK is inputted to the second clock terminal CK2.

In the unit shift register $SR_n$ according to the first preferred embodiment, the transistors Q2 and QD2 are on during the HIGH level period of the first output signal $G_{n+1}$ of the next stage, and only during that period, the first and second output terminals OUT and OUTD are at the LOW level and low impedance. In other words, during the other period, the first and second output terminals OUT and OUTD are LOW in the floating state.

On the other hand, in the unit shift register $SR_n$ according to this preferred embodiment, the transistors Q2 and QD2 are turn on every time that the clock signal /CLK inputted to the second clock terminal CK2 becomes HIGH. Accordingly, the first and second output terminals OUT and OUTD are set at the LOW level and low impedance repeatedly at short time intervals. Therefore, the low-level potentials of the first and second output signals $G_n$ and $GD_n$ become more stable. This consequently prevents a malfunction in the gate line driving circuit 30 and causes less display problem in the display apparatus because the levels of the gate lines GL which are not being selected are stabilized.

Third Preferred Embodiment

As field-effect transistors included in a gate line driving circuit in a display apparatus, amorphous silicon thin film transistors (a-Si TFTs) are widely used. It is known that a-Si TFTs have threshold voltages that shift largely when their gate electrodes are continuously biased. This phenomenon raises a problem of causing a malfunction in the gate line driving circuit. It is also known that not only a-Si TFTs but also organic TFTs cause a similar problem.

In the unit shift register SR according to the second preferred embodiment (FIG. 10), for example, the gates of the transistors Q2 and Q2D are repeatedly biased to the HIGH level by a clock signal inputted to the second clock terminal CK2. For this reason, in the case or the unit shift register SR constituted by a-Si TFTs or organic TFTs, the threshold voltages of the transistors Q2 and Q2D shift in the normal direction. This deteriorates the drive capabilities of the transistors Q2 and Q2D and makes it difficult to set the first and second output terminals OUT and OUTD at the sufficiently LOW level and low impedance. As a result, the effect of the second preferred embodiment is lessened, which increases the occurrence of a malfunction in the gate line driving circuit 30.

To avoid this problem, for example increasing the channel widths of the transistors Q2 and Q2D can be considered in order to improve the drive capabilities, which, however, is not preferable because of accompanied increase in the area of the circuit. A third preferred embodiment shows a variation of the second preferred embodiment, which can solve the above problem without any increase in the area of the circuit.

Figure 11:
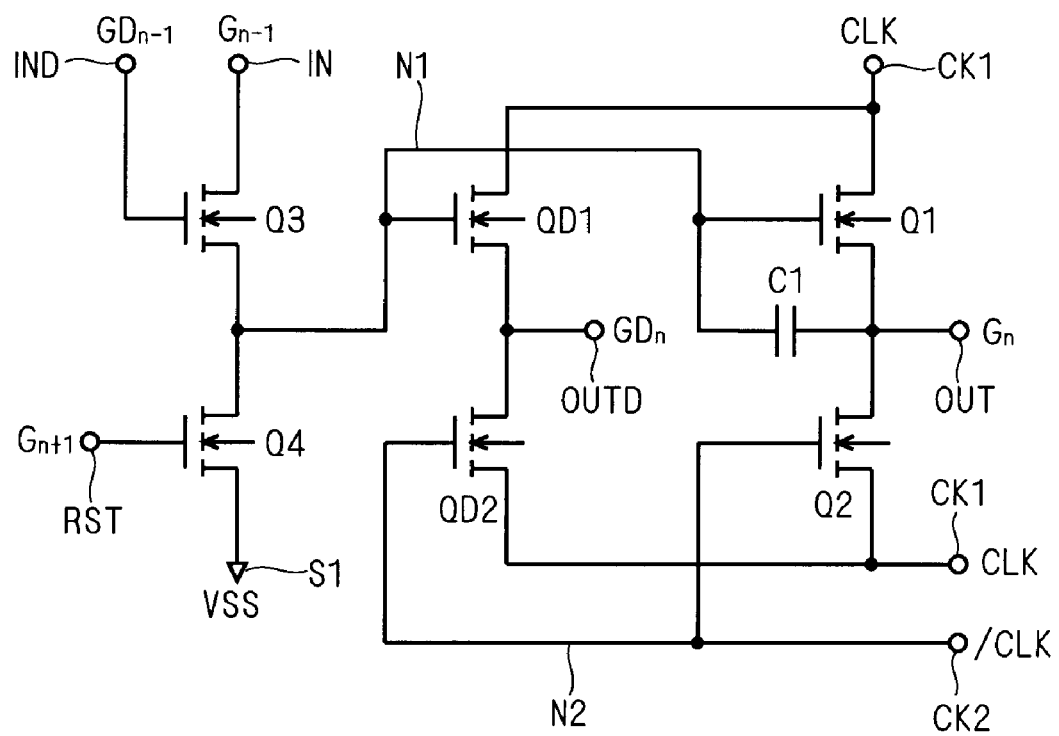
FIG. 11 is a circuit diagram showing a configuration of a unit shift register according to a third preferred embodiment.

FIG. 11 is a circuit diagram showing a configuration of a unit shift register SR according to the third preferred embodiment. In FIG. 11, elements having similar functions to those shown in FIG. 10 are designated by the same reference numerals or characters. In the unit shift register SR of FIG. 11, the sources of the transistors Q2 and QD2 are connected to the first clock terminal CK1. In other words, the sources of the transistors Q2 and QD2 receive a clock signal having a different phase from that inputted to the gates thereof. Other than this, the circuit of FIG. 11 is the same as that of FIG. 10.

Herein, also, the unit shift register $SR_n$ of the nth stage will be described as a representative example, assuming that the clock signal CLK is inputted to the first clock terminal CK1 and the clock signal /CLK is inputted to the second clock terminal CK2 in the unit shift register $SR_n$.

Since the clock signals CLK and /CLK are complementary to each other, during a time interval that the clock signal /CLK is at the HIGH level and the transistors Q2 and QD2 are on, the sources of the transistors Q2 and QD2 are at the LOW level with the clock signal CLK. Therefore, as in the case of the second preferred embodiment, the transistors Q2 and QD2 can set the first and second output terminals OUT and OUTD at the LOW level and low impedance every time that the clock signal /CLK becomes HIGH, in which case the effect of the second preferred embodiment can be achieved.

On the contrary, during a time interval that the clock signal /CLK is at the LOW level and the transistors Q2 and QD2 are off, the sources of the transistors Q2 and QD2 are at the HIGH level with the clock signal CLK. This is equivalent to the state where the gates of the transistors Q2 and QD2 are negative-biased with respect to the sources thereof. Thereby, the threshold voltages that have been shifted in the normal direction return to the negative direction for recovery. This prevents deterioration in the drive capabilities of the transistors Q2 and QD2, thus solving the above problem. It is obvious that this is not accompanied with any increase in the area of the circuit.

Theoretically, this preferred embodiment may also use such a two-phase clock that the clock signal /CLK falls simultaneously with the rise of the clock signal CLK and the clock signal /CLK rises simultaneously with the fall of the clock signal CLK. In practical use, however, due to variations in the timing of the rise and fall of the clock signals CLK and /CLK, the source potentials can possibly rise before the transistors Q2 and Q2D of the unit shift register $SR_n$ are completely turned off. In that case, a resultant unnecessary rise in the levels of the first and second output terminals OUT and OUTD can cause a malfunction. In this preferred embodiment, therefore, it is preferable to insert a certain time interval between the HIGH level period of the clock signal CLK and the HIGH level period of the clock signal /CLK as in the example of FIG. 4.

Fourth Preferred Embodiment

FIG. 12 is a circuit diagram showing a configuration of a unit shift register SR according to a fourth preferred embodiment. In FIG. 12, elements having similar functions to those shown in FIG. 5 are designated by the same reference numerals or characters.

As shown in FIG. 12, the unit shift register SR according to the fourth preferred embodiment has a second power supply terminal S2 supplied with a high power supply potential VDD. The unit shift register SR further includes a transistor Q5 connected between the second power supply terminal S2 and the node N2 (the gates of the transistors Q2 and QD2), and a transistor Q6 connected between the node N2 and the first power supply terminal S1. The gate of the transistor Q5 is connected to the second power supply terminal S2 (i.e., the transistor Q5 is diode-connected), and the gate of the transistor Q6 is connected to the node N1 (the gates of the transistors Q1 and QD1). The gate of the transistor Q4 is connected to the reset terminal RST as in the first preferred embodiment.

The transistor Q6 has an on-state resistance that is set sufficiently lower than that of the transistor Q5. Therefore, when the node N1 is at the HIGH level and the transistor Q6 is on, the node N2 is at the LOW level. On the contrary, when the node N1 is at the LOW level and the transistor Q6 is off, the node N2 is charged to the HIGH level by the transistor Q5. That is, the transistors Q5 and Q6 serve as a ratio inverter using the node N1 as its input end and the node N2 as its output end.

Therefore, while the unit shift register SR according to this preferred embodiment is in the reset state where the node N1 is at the LOW level, the transistors Q2 and QD2 are on because the node N2 is maintained at the HIGH level by the inverter constituted by the transistors Q5 and Q6. In other words, while the unit shift register SR does not output the output signal G (while the gate line GL is not being selected), the first and second output terminals OUT and OUTD are maintained at the LOW level and low impedance. This further stabilizes the low-level potentials of the first and second output signals $G_n$ and $GD_n$, thus preventing a malfunction in the gate line driving circuit 30.

Unlike in the second and third preferred embodiments, this preferred embodiment allows a reduction in alternating-current power consumption by the unit shift registers SR because it is not necessary to supply a clock signal to the gates of the transistors Q2 and QD2. In other words, there is also an advantage of reduced power consumption by a clock-signal generating circuit (the clock generator 31 shown in FIG. 6). It is, however, to be noted that the threshold voltages of the transistors Q2 and QD2 are more likely to shift because the gates of the transistors Q2 and QD2 are continuously maintained at the HIGH level.

Fifth Preferred Embodiment

Figure 13:
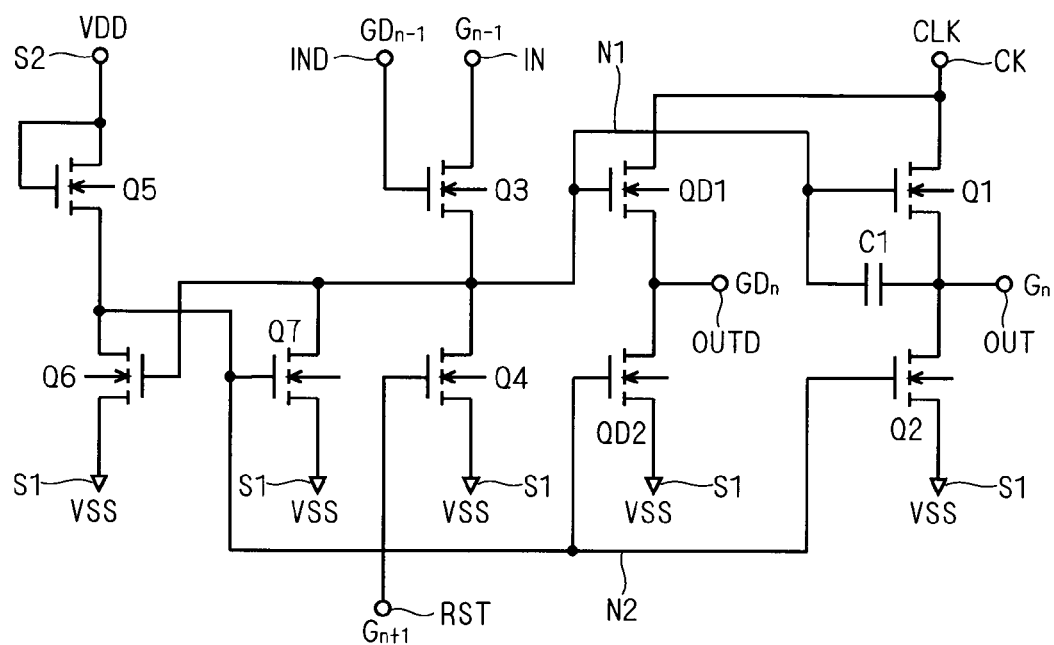
FIG. 13 is a circuit diagram showing a configuration of a unit shift register according to a fifth preferred embodiment.

This preferred embodiment shows a variation of the fourth preferred embodiment (FIG. 12). FIG. 13 is a circuit diagram showing a configuration of a unit shift register SR according to a fifth preferred embodiment. In FIG. 13, elements having similar functions to those shown in FIG. 12 are designated by the same reference numerals or characters. As shown in FIG. 13, the unit shift register SR according to this preferred embodiment includes a transistor Q7 connected between the node N1 and the first power supply terminal S1 (VSS) and having a gate connected to the node N2. Other than this, the circuit of FIG. 13 is the same as that of FIG. 12.

The transistor Q7 is turned on when the node N2 rises to the HIGH level, serving to discharge the node N1. In the unit shift register SR according to this preferred embodiment, therefore, the potential of the node N1 is fixed at VSS by the transistor Q7 while the transistors Q1 and QD1 are off (while the gate line GL is not being selected).

In the unit shift register SR with no transistor Q7 according to the fourth preferred embodiment (FIG. 12), if a clock signal is inputted to the clock terminal CK while the transistors Q1 and QD1 are off, the level of the node N1 can possibly rise due to capacitive coupling through gate-drain overlap capacitances of the transistors Q1 and QD1. A rise in the level of the node N1 causes current flows in the transistors Q1 and QD1, thereby causing a problem that the first and second output signals G and GD unnecessarily rise to the HIGH level while the gate line GL is not being selected. On the other hand, this preferred embodiment can prevent a rise in the level of the node N1 while the gate line GL is not being selected, and thus can prevent the occurrence of this problem.

Sixth Preferred Embodiment

The problem of a rise in the level of the node N1 while the gate line GL is not being selected, discussed in the fifth preferred embodiment, can arise in any of the unit shift registers SR according to the first to fourth preferred embodiments. This preferred embodiment suggests a unit shift register SR that takes measures against the problem.

FIG. 14 is a circuit diagram showing a configuration of a unit shift register SR according to a sixth preferred embodiment. In FIG. 14, elements having similar functions to those shown in FIG. 10 are designated by the same reference numerals or characters. As shown in FIG. 14, the unit shift register SR according this preferred embodiment includes a capacitive element C2 connected between the node N1 and the second clock terminal CK2. Other than this, the circuit of FIG. 14 is the same as that of FIG. 10.

As in the second preferred embodiment, the first and second clock terminals CK1 and CK2 receive clock signals having different phases from each other. In this preferred embodiment, however, it is necessary to combine the timing of those clock signals so that the rise of the clock signal inputted to the first clock terminal CK1 coincides with the fall of the clock signal inputted to the second clock terminal CK2.

Herein, also, the unit shift register $SR_n$ of the nth stage will be described as a representative example, assuming that the clock signal CLK is inputted to the first clock terminal CK1 and the clock signal /CLK is inputted to the second clock terminal CK2 in the unit shift register $SR_n$.

In the unit shift register $SR_n$, while the gate line GL is not being selected, the transistors Q1 and QD1 are off, but upon a rise of the clock signal CLK at the first clock terminal CK1, the level of the node N1 rises due to coupling through the gate-drain overlap capacitances of the transistors Q1 and QD1. However, since the clock signal /CLK at the second clock terminal CK2 falls at this time, the level of the node N1 is pulled down due to coupling through the capacitive element C2. In other words, the capacitive element C2 serves to cancel a rise in the level of the node N1 caused by the clock signal CLK.

Therefore, this preferred embodiment can prevent a rise in the level of the node N1 while the gate line GL is not being selected, and thereby prevent the occurrence of such a malfunction that the first and second output signals G and GD unnecessarily rise to the HIGH level during that period.

While FIG. 14 shows such a configuration that the capacitive element C2 is additionally provided in the unit shift register SR according to the second preferred embodiment (FIG. 10), this preferred embodiment is also applicable to any of the circuits described in the first and third to fifth preferred embodiments (FIGS. 5 and 11 to 13).

Seventh Preferred Embodiment

Figure 15:
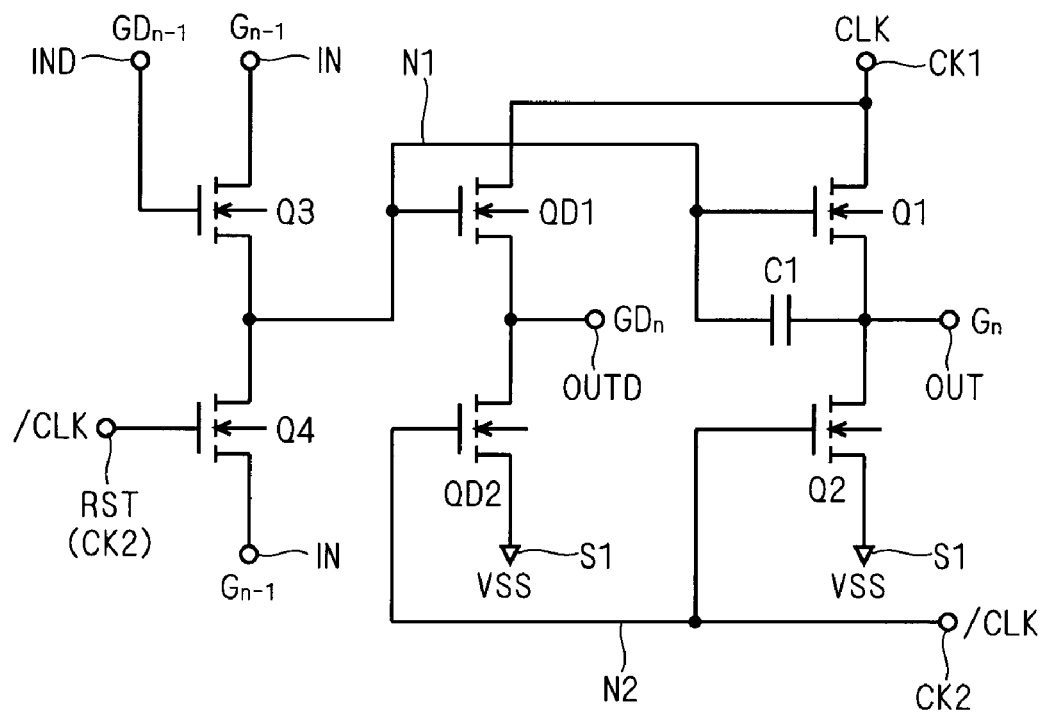
FIG. 15 is a circuit diagram showing a configuration of a unit shift register according to a seventh preferred embodiment.

FIG. 15 is a circuit diagram showing a configuration of a unit shift register SR according to a seventh preferred embodiment. In FIG. 15, elements having similar functions to those shown in FIG. 10 are designated by the same reference numerals or characters.

As shown in FIG. 15, in the unit shift register SR according to this preferred embodiment, the reset terminal RST (the gate of the transistor Q4) is connected to the second clock terminal CK2 without being connected to any unit shift register SR of a succeeding stage. By so doing, a clock signal having a different phase from that inputted to the first clock terminal CK1 is inputted to the gate of the transistor Q4. More specifically, the transistor Q4 receives a clock signal having the same phase as that inputted to the first clock terminal CK1 of the preceding stage.

Further, the source of the transistor Q4 is connected to the input terminal IN. By so doing, the first output signal $G_{n-1}$ of the preceding stage is inputted to the source of the transistor Q4. Since the node N2 is connected to the second clock terminal CK2 in the circuit of FIG. 15, the circuit of FIG. 15 is almost the same as that of FIG. 10 except for the aforementioned change in the signals inputted to the gate and source of the transistor Q4.

Herein, also, the unit shift register $SR_n$ of the nth stage will be described as a representative example, assuming that the clock signal CLK is inputted to the first clock terminal CK1 and the clock signal /CLK is inputted to the second clock terminal CK2 in the unit shift register $SR_n$. Since the operation of the unit shift register SR according to this preferred embodiment is basically the same as that described in the first preferred embodiment, FIG. 8 is herein referred to again to simplify the description.

At time $t_1$, with the clock signal /CLK inputted to the first clock terminal CK1 of the unit shift register $SR_{n-1}$ rising to the HIGH level, the first and second output signals $G_{n-1}$ and $GD_{n-1}$ of the preceding stage shall become HIGH. At this time, although the gate of the transistor Q4 in the unit shift register $SR_n$ becomes HIGH, the transistor Q4 is not turned on because its source also becomes HIGH. Hence, the node N1 is charged to the HIGH level through the transistor Q3. Thereby, the unit shift register $SR_n$ transitions from its reset state to its set state.

When the clock signal /CLK falls at time $t_2$, the first and second output signals $G_{n-1}$ and $GD_{n-1}$ of the preceding stage also fall to the LOW level. However, since the transistor Q3 is turned off and the transistor Q4 remains off, the level of the node N1 remains HIGH (VDD−Vth) in a floating state.

When the clock signal CLK rises at time $t_3$, the voltage at the node N1 is boosted and the first and second output signals $G_n$ and $GD_n$ become HIGH (VDD). Then, when the clock signal CLK falls to the LOW level at time $t_4$, the first and second output signals $G_n$ and $GD_n$ of the unit shift register $SR_n$ also fall to the LOW level. Thereby, the level of the node N1 falls to VDD−Vth as well.

Then, when the clock signal /CLK rises at time $t_5$, the transistor Q4 is turned on and the node N1 is discharged to the LOW level since the first output signal $G_{n-1}$ is LOW at this time. That is, the unit shift register $SR_n$ returns to its reset state, in which state the transistors Q1 and Q1D are off. After that, when the clock signal /CLK falls to the LOW level at time $t_6$, the transistor Q4 returns to its off state.

As described above, the unit shift register SR according to the seventh preferred embodiment can operate in the same manner as the unit shift register SR according to the first preferred embodiment operates. Specifically, since the transistor Q3 is charged at high speed by using the first and second output signals $G_{n-1}$ and $GD_{n-1}$ of the preceding stage, this preferred embodiment can achieve the same effect as that of the first preferred embodiment.

In this preferred embodiment, it is not necessary to connect each unit shift register SR to a unit shift register of the next stage. This increases flexibility of circuit layout and advantageously contributes to a reduction in the area of the circuit. It is, however, to be noted that a continuous supply of a clock signal to the gate of the transistor Q4 increases alternating-current power of a clock-signal generating circuit (the clock generator 31 of FIG. 6).

While this preferred embodiment shows the unit shift register SR with such a configuration that the first output signal G of the preceding stage is inputted to the source of the transistor Q4, the second output signal GD of the preceding stage may be inputted instead. In that case, however, it is to be noted that an increase in the capacitive load on the second output terminal OUTD in each unit shift register SR reduces the rising speed of the second output signal GD, thereby somewhat lessening the effect of the present invention.

While FIG. 15 shows a modified configuration of the unit shift register SR according the second preferred embodiment (FIG. 10) with changes made in the signals inputted to the gate and source of the transistor Q4, this preferred embodiment is also applicable to the transistor Q4 in any of the circuits described above in the first and third to sixth preferred embodiments (FIGS. 5 and 11 to 14) and the circuits to be described later in eighth to eleventh preferred embodiments (FIGS. 16 to 19).

Eighth Preferred Embodiment

As described above, while the node N1 is LOW (while the gate line GL is not being selected) in the unit shift registers SR according to the fourth and fifth preferred embodiments (FIGS. 12 and 13), the node N2 is held at the HIGH level by the inverter constituted by the transistors Q5 and Q6. During that while, the transistors Q2 and QD2 discharging the first and second output terminals OUT and OUTD remain on. This holds the first and second output terminals OUT and OUTD at the LOW level and low impedance, thereby preventing the generation of an error signal. However, the threshold voltages of the transistors Q2 and QD2 are caused to shift because the gates of the transistors Q2 and QD2 are continuously maintained at the HIGH level.

On the other hand, in the unit shift registers according to the second and third preferred embodiments (FIGS. 10 and 11), the clock signal /CLK is inputted to the gates of the transistors Q2 and QD2. That is, the levels of those gates swing in a certain cycle and are not continuously maintained at the HIGH level, which controls a shift in the threshold voltage. However, the effect of preventing the generation of an error signal is lessened as compared with that achieved by the fourth and fifth preferred embodiments because the first and second output terminals OUT and OUTD turn into a high impedance state in a certain cycle.

Japanese Patent Application Laid-open No. 2006-24350 has suggested a unit shift register that can solve these problems in its FIGS. 7 and 11. Especially, the unit shift register in FIG. 11 of this publication has two output terminals (OUT, CR) as in the present invention. In an eighth preferred embodiment, the technique suggested by and shown in FIG. 11 of Japanese Patent Application Laid-open No. 2006-24350 is applied to the unit shift registers SR according to the present invention.

Figure 16:
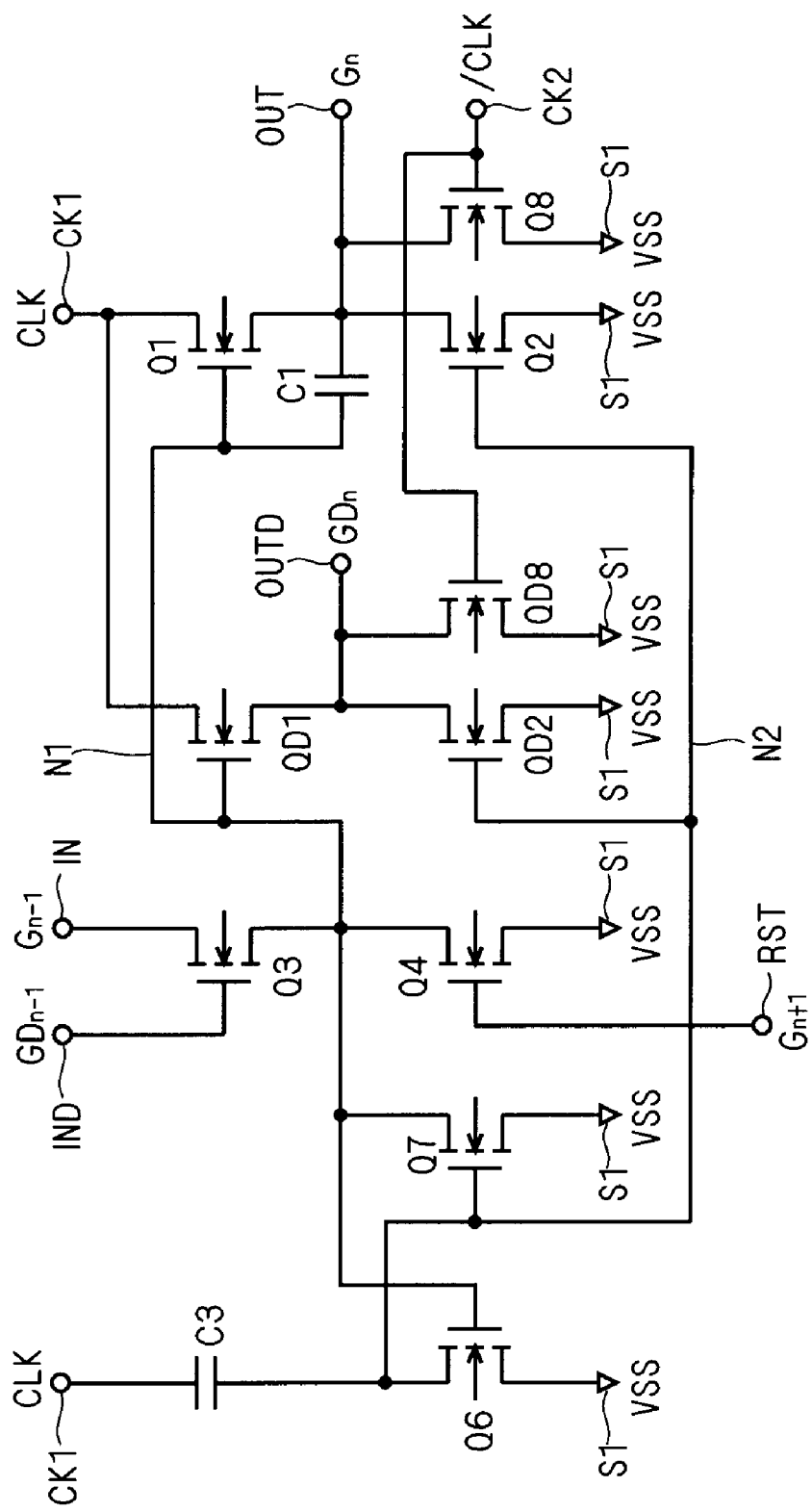
FIG. 16 is a circuit diagram showing a configuration of a unit shift register according to an eighth preferred embodiment.

FIG. 16 is a circuit diagram of a unit shift register according to the eighth preferred embodiment. This unit shift register SR is configured such that the technique suggested by and shown in FIG. 11 of Japanese Patent Application Laid-open No. 2006-24350 is applied to the unit shift register SR of the fifth preferred embodiment (FIG. 13). In FIG. 16, elements having similar functions to those shown in FIG. 13 are designated by the same reference numerals or characters, where the first clock terminal CK1 in FIG. 16 is equivalent to the clock terminal CK in FIG. 13.

While the unit shift register SR shown in FIG. 13 includes a ratio inverter (the transistors Q5 and Q6 in FIG. 13) serving as a "pull-down driving circuit" that drives the transistors Q2 and QD2 to pull down the first and second output terminals OUT and OUTD, the unit shift register SR in FIG. 16 includes, instead of that inverter, an inverter with capacitive load, which is constituted by a capacitive element C3 and the transistor Q6.

This inverter also use the gates of the transistors Q1 and QD1 (the node N1) as its input end, and the gates of the transistors Q2 and QD2 (the node N2) as its output end. However, this inverter differs from normal inverters in that a clock signal inputted to the first clock terminal CK1 is supplied as a power source. That is, in the inverter, the capacitive element C3 is connected between the node N2 and the first clock terminal CK1. The capacitive element C3 serves not only as a load on the inverter but also as a coupling capacitance that couples a clock signal at the first clock terminal CK1 to the node N2. The transistor Q6, as in the case of FIG. 13, is connected between the node N2 and the first power supply terminal S1 and has its gate connected to the node N1.

The unit shift register SR further includes a transistor Q8 connected between the first output terminal OUT and the first power supply terminal S1, and a transistor QD8 connected between the second output terminal OUTD and the first power supply terminal S1. The gates of these transistors Q8 and QD8 are both connected to the second clock terminal CK2. The second clock terminal CK2 receives a clock signal having a different phase from that inputted to the first clock terminal CK1. As can be seen from the comparison with FIG. 10, the transistors Q8 and QD8 are equivalent to the transistors Q2 and QD2 according to the second preferred embodiment.

Herein, also, the operation of the unit shift register $SR_n$ of the nth stage will be described as a representative example, assuming that the clock signals CLK and /CLK are inputted to the first and second clock terminals CK1 and CK2, respectively.

First, the operation of the gate line $GL_n$ while not being selected will be described. During this while, the node N1 of the unit shift register $SR_n$ is at the LOW level. Since the inverter constituted by the capacitive element C3 and the transistor Q6 is activated by power supply with the clock signal CLK, it outputs a HIGH level to the node N2 when the clock signal CLK becomes HIGH. More specifically, since the transistor Q6 is off while the node N1 is LOW, the level of the node N2 rises to the HIGH level due to coupling through the capacitive element C3, following the clock signal CLK rising to the HIGH level.

Accordingly, the transistors Q2 and QD2 are tuned on every time that the clock signal CLK becomes HIGH, and they respectively set the first and second output terminals OUT and OUTD at the LOW level and low impedance. On the other hand, the transistors Q8 and QD8 are turned on every time that the clock signal /CLK inputted to the second clock terminal CK2 becomes HIGH.

That is, while the gate line $GL_n$ is not being selected, a pair of the transistors Q2 and QD2 and a pair of the transistors Q8 and QD8 are alternately turned on in synchronization with the clock signals CLK and /CLK. Accordingly, the first and second output terminals OUT and OUTD are at the LOW level and low impedance during almost all the period, so that the effect of preventing the generation of an error signal is as high as in the fifth preferred embodiment.

Besides, the levels at the gates of the transistors Q2, QD2, Q8 and QD8 each swing in a certain cycle and thus are not continuously maintained at the HIGH level, which prevents a shift in the threshold voltages of those transistors.

Next, the operation of the gate line $GL_n$ while being selected is described. During this while, the node N1 of the unit shift register $SR_n$ is at the HIGH level. Since the transistor Q6 is on while the node N1 is HIGH, the inverter constituted by the capacitive element C3 and the transistor Q6 outputs a LOW level to the node N2. The clock signal /CLK is at the LOW level during that period. Accordingly, the transistors Q2, QD2, Q8 and QD8 are maintained in the OFF state, so that the unit shift register $SR_n$ can output the first and second signals $G_n$ and $GD_n$ properly.

As described above, this preferred embodiment can have a high effect of preventing the generation of an error signal while preventing a shift in the threshold voltages (i.e., deterioration in the drive capabilities) of the transistors Q2, QD2, Q8 and QD8.

Ninth Preferred Embodiment

In this preferred embodiment, the technique used in the third preferred embodiment is applied to the unit shift register SR according to the eighth preferred embodiment (FIG. 16).

Figure 17:
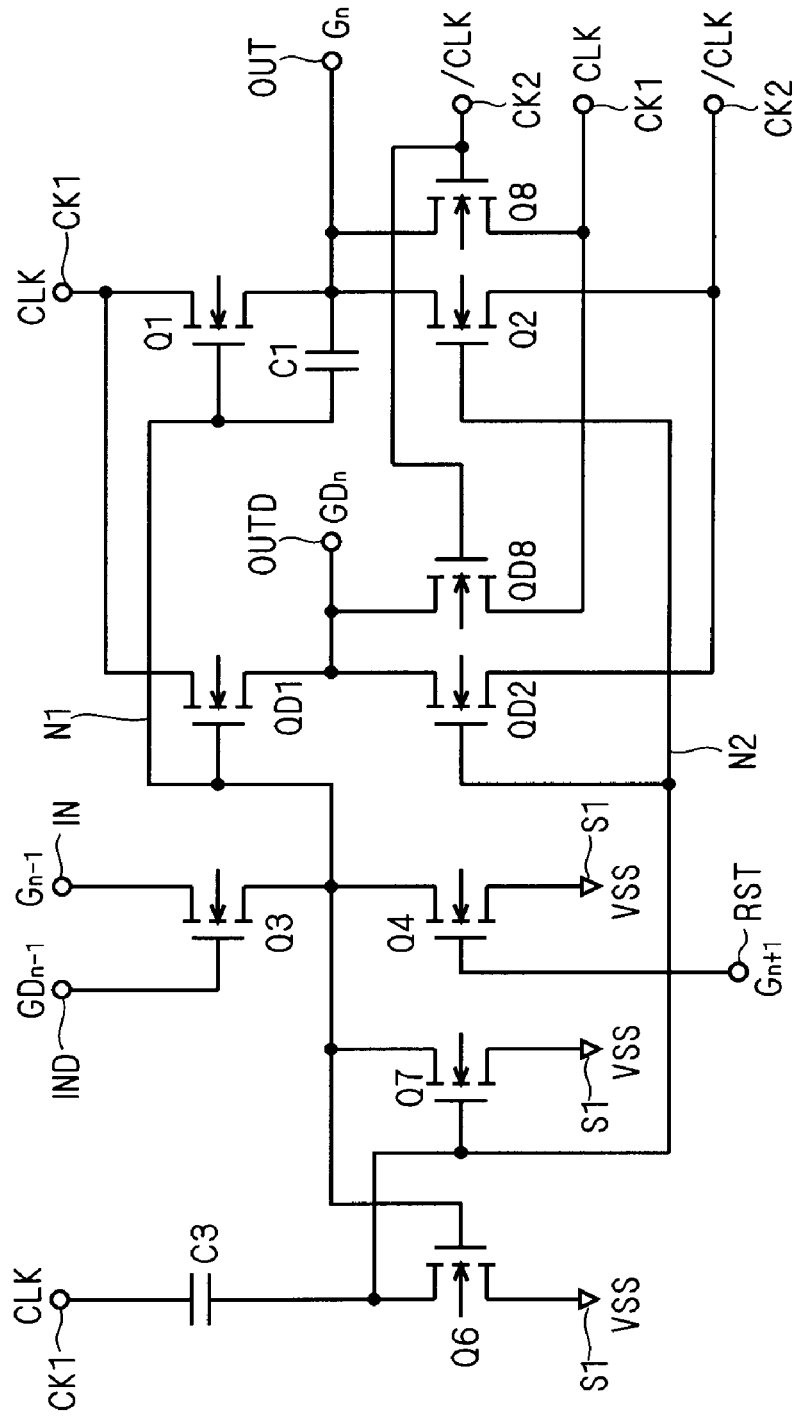
FIG. 17 is a circuit diagram showing a configuration of a unit shift register according to a ninth preferred embodiment.

FIG. 17 is a circuit diagram showing a configuration of a unit shift register SR according to a ninth preferred embodiment. The unit shift register SR is different from the circuit shown in FIG. 16 in that the sources of the transistors Q2 and QD2 are connected to the second clock terminal CK2, and the sources of the transistors Q8 and QD8 are connected to the first clock terminal CK1. In other words, the transistors Q2, QD2, Q8 and QD8 receive at their sources a clock signal having a different phase from that inputted to their gates. Other than that, the unit shift register SR in FIG. 17 is the same as that shown in FIG. 16.

Herein, also, the unit shift register $SR_n$ of the nth stage will be described as a representative example, assuming that the clock signal CLK is inputted to the first clock terminal CK1 and the clock signal /CLK is inputted to the second clock terminal CK2.

The clock signals CLK and /CLK are complementary to each other. Thus, while the clock signal CLK is HIGH and the transistors Q2 and QD2 are on, the sources of the transistors Q2 and QD2 are at the LOW level with the clock signal /CLK. Similarly, while the clock signal /CLK is HIGH and the transistors Q8 and QD8 are on, the sources of the transistors Q8 and QD8 are at the LOW level with the clock signal CLK. Accordingly, the transistors Q2, QD2, Q8 and QD8 can discharge the first and second output terminals OUT and OUTD in the same manner as in the case where their sources are connected to the first power supply terminal S1.

While the clock signal CLK is LOW and the transistors Q2 and QD2 are off, the sources of the transistors Q2 and QD2 are at the HIGH level with the clock signal /CLK. Similarly, while the clock signal /CLK is LOW and the transistors Q8 and QD8 are off, the sources of the transistors Q8 and QD8 are at the HIGH level with the clock signal CLK. This is equivalent to the state where, when the transistors Q2, QD2, Q8 and QD8 are off, the gates of the transistors Q2, QD2, Q8 and QD8 are negative-biased with respect to the sources thereof. Thereby, the threshold voltages that have shifted in the normal direction return to the negative direction for recovery. This prevents deterioration in the drive capabilities of the transistors Q2, QD2, Q8 and QD8.

Tenth Preferred Embodiment

Figure 18:
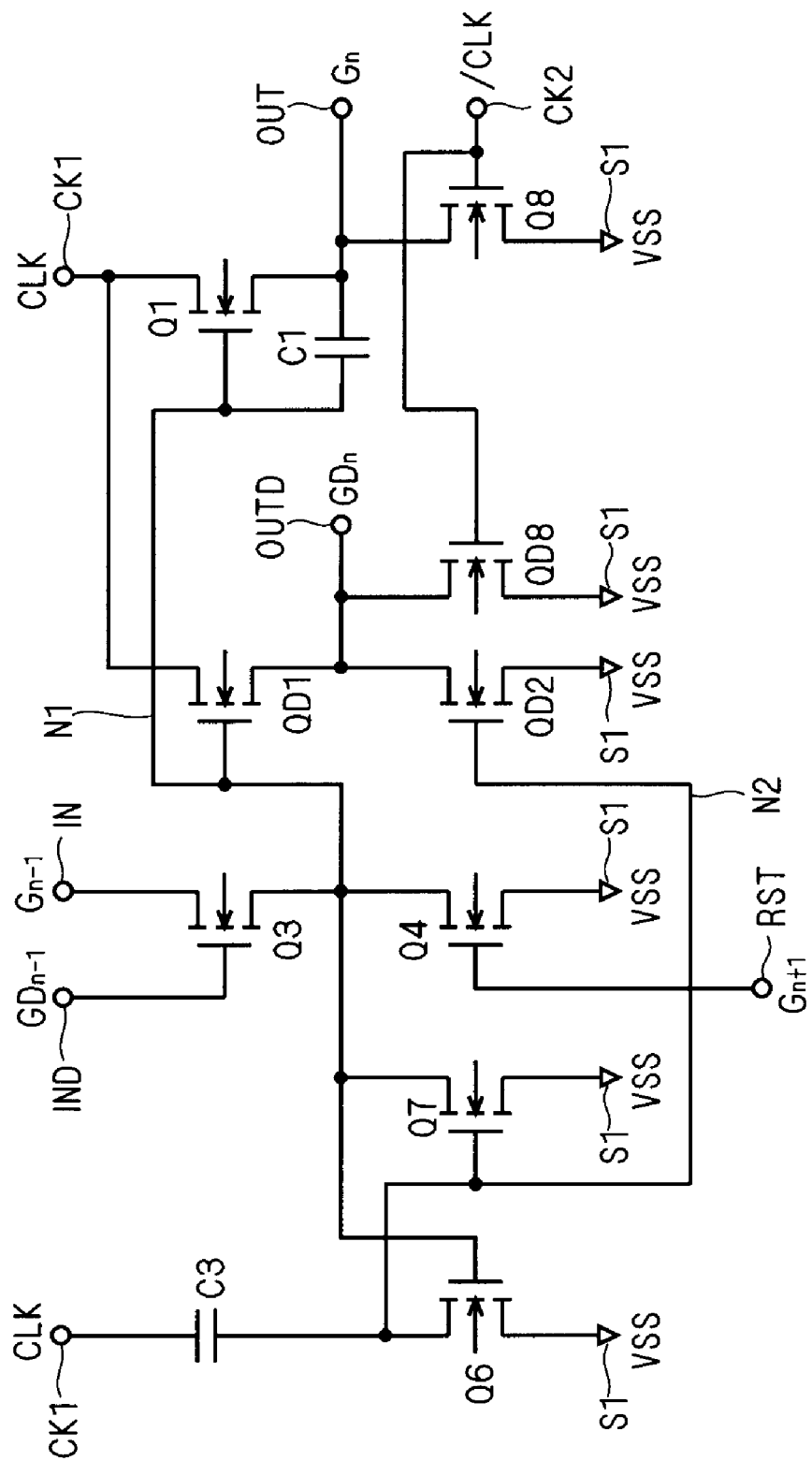
FIG. 18 is a circuit diagram showing a configuration of a unit shift register according to a tenth preferred embodiment.

FIG. 18 is a circuit diagram showing a configuration of a unit shift register SR according to a tenth preferred embodiment. This unit shift register SR is configured such that the transistor Q2 is omitted from the circuit of FIG. 16.

In the absence of the transistor Q2, the first output terminal OUT is at a high impedance except when the clock signal /CLK is at the HIGH level. That is, the effect of preventing the generation of an error signal at the first output terminal OUT is almost the same as that achieved with the circuit of FIG. 10. By eliminating the transistor Q2, adverse effects that can occur in display characteristics of the display apparatus can be lessened if the VSS level for the potential of each pixel is reduced.

This preferred embodiment allows a reduction in circuit area by the area of the transistor Q2 that has been omitted. Besides, since the parasitic capacitance at the node N2 is reduced and accordingly the node N2 can easily be charged, the capacitive element C3 can be set to a smaller value. That is, reducing the area of the capacitive element C3 can also contribute to a reduction in the circuit area. Further, cutting back electricity consumption by the gate capacitance of the transistor Q2 can contribute to a reduction in circuit power consumption.

If the purpose is to reduce the circuit area, we can also consider omission of the transistor QD2 instead of the transistor Q2 (omitting both the transistors Q2 and QD2 results in the same configuration as described in the second preferred embodiment (FIG. 10)). However, omitting the transistor QD2 is not preferable because of a likelihood of occurrence of a malfunction than in the case of omitting the transistor Q2. The reason for this is as follows.

If the transistor QD2 is omitted, the second output terminal OUTD is put in a high impedance state at the rise of a clock signal at the first clock terminal CK1. The capacitive load on the second output terminal OUTD (i.e., the gate capacitance of the transistor Q3 of the next stage) is smaller than that of the first output terminal OUT (i.e., a capacitance associated with the gate line GL). Therefore, if the second output terminal OUTD is put in a high impedance state, the level of the second output terminal OUTD rises more easily than in the case where the first output terminal OUT is put in a high impedance state by the influence of a noise or the like. In other words, the second output signal GD is likely to be outputted as an error signal. In order to prevent this, it is preferable to keep the transistor QD2.

The aforementioned ninth preferred embodiment is also applicable to this preferred embodiment. Specifically, the circuit of FIG. 18 may be configured such that the source of the transistor QD2 is connected to the second clock terminal CK2, and the sources of the transistors Q8 and QD8 are connected to the first clock terminal CK1.

Eleventh Preferred Embodiment

Figure 19:
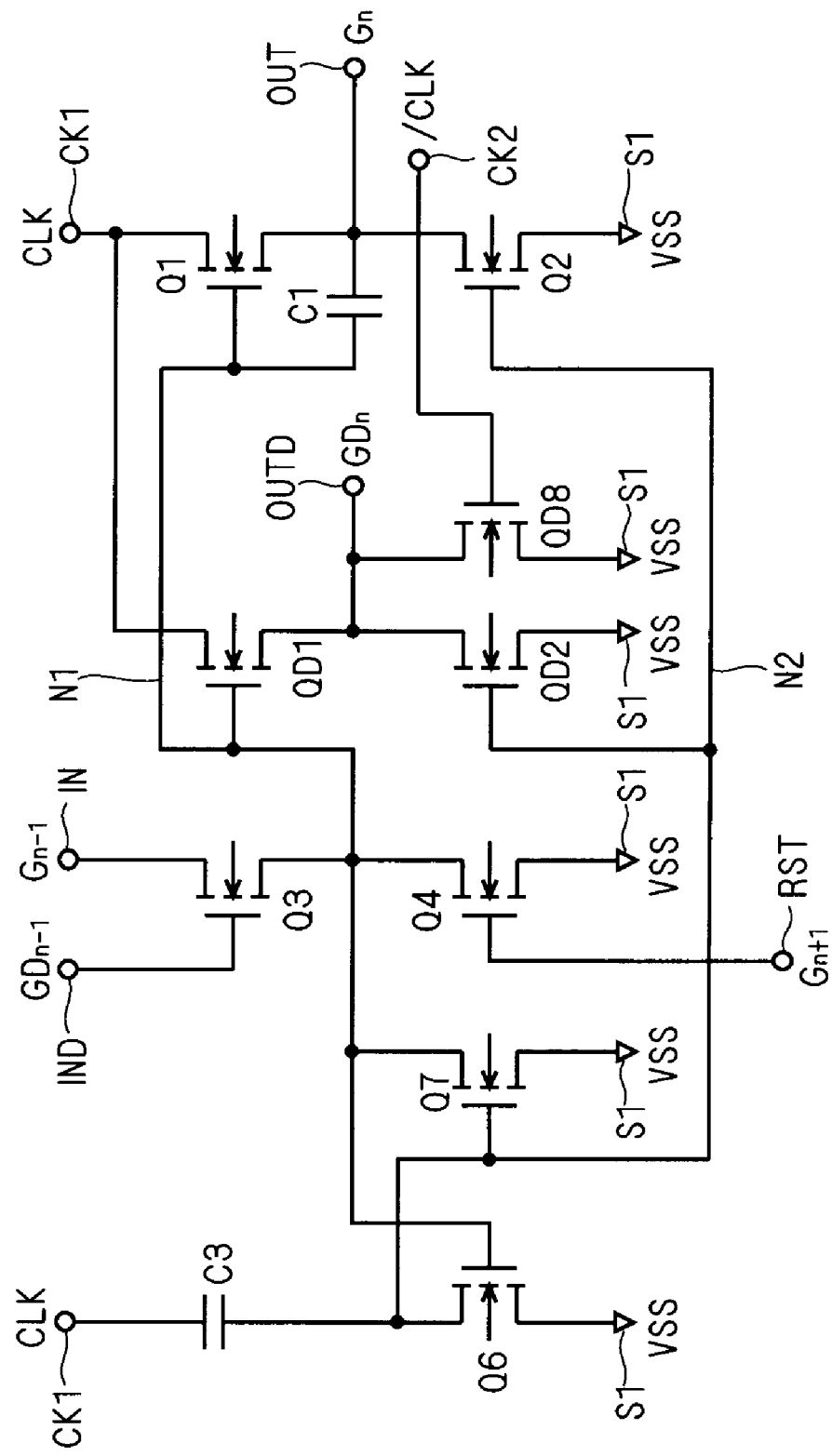
FIG. 19 is a circuit diagram showing a configuration of a unit shift register according to an eleventh preferred embodiment.

FIG. 19 is a circuit diagram showing a configuration of a unit shift register SR according to an eleventh preferred embodiment. This unit shift register SR is configured such that the transistor Q8 is omitted from the circuit shown in FIG. 16. In this case, while the gate line GL is not being selected, the first output terminal OUT is in a high impedance state except when the clock signal CLK is at the HIGH level. Although the first output terminal OUT is put in a high impedance state with different timing, the effect of preventing the generation of an error signal is almost the same as in the circuit shown in FIG. 18.

Eliminating the transistor Q8 allows a reduction in the area of the unit shift register SR. There is also an advantage of reduced power consumption by the gate capacitance of the transistor Q8.

If the purpose is to reduce the circuit area, we can also consider omission of not only the transistor Q8 but also the transistor QD8; however, the transistor QD8 should preferably be kept in order to prevent a malfunction. As previously described, the second output terminal OUTD has a smaller capacitive load than the first output terminal OUT. Thus, if the second output signal OUTD is put in a high impedance state due to the elimination of the transistor QD8, the second output signal GD is likely to be generated as an error signal by the influence of a noise or the like (although the likelihood is not so great as compared with the case of eliminating the transistor QD2 in the tenth preferred embodiment). In order to prevent this, it is preferable to keep the transistor QD8.

The aforementioned ninth preferred embodiment is also applicable to this preferred embodiment. Specifically, the circuit of FIG. 19 may be configured such that the sources of the transistors Q2 and QD2 are connected to the second clock terminal CK2, and the source of the transistor QD8 is connected to the first clock terminal CK1.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
    first and second input terminals, first and second output terminals, a first clock terminal, and a reset terminal;

a first transistor configured to supply a first clock signal inputted to said first clock terminal to said first output terminal;
a second transistor configured to discharge said first output terminal;
a third transistor configured to supply said first clock signal to said second output terminal; and
a fourth transistor configured to discharge said second output terminal,
said first transistor and said third transistor each having a control electrode connected to a first node,
said second transistor and said fourth transistor each having a control electrode connected to a second node, and
said shift register circuit further comprising:
a fifth transistor connected between said first node and said first input terminal and having a control electrode connected to said second input terminal; and
a sixth transistor having a control electrode connected to said reset terminal and configured to discharge said first node,
wherein a pulse signal is input to the first input terminal.

2. The shift register circuit according to claim 1, wherein said second node is connected to said reset terminal.

3. The shift register circuit according to claim 1, wherein said second node is connected to a second clock terminal which receives a second clock signal having a different phase from said first clock signal.

4. The shift register circuit according to claim 3, wherein
said second transistor is connected between said first output terminal and said first clock terminal, and
said fourth transistor is connected between said second output terminal and said first clock terminal.

5. The shift register circuit according to claim 1, further comprising:
an inverter using said first node as its input terminal and said second node as its output terminal.

6. The shift register circuit according to claim 5, further comprising:
a seventh transistor having a control electrode connected to said second node and discharging said first node.

7. The shift register circuit according to claim 1, further comprising:
a seventh transistor having a control electrode connected to a second clock terminal which receives a second clock signal having a different phase from said first clock signal, discharging said second output terminal, aside from said fourth transistor;
an eighth transistor having a control electrode connected to said first node and discharging said second node; and
a first capacitive element connected between said second node and said first clock terminal.

8. The shift register circuit according to claim 7, wherein said
said fourth transistor is connected between said second output terminal and said second clock terminal.

9. The shift register circuit according to claim 7, further comprising:
a ninth transistor having a control electrode connected to said second clock terminal and discharging said first output terminal.

10. The shift register circuit according to claim 9, wherein said second transistor is connected between said first output terminal and said second clock terminal.

11. The shift register circuit according to claim 1, further comprising:
an seventh transistor having a control electrode connected to said first node and discharging said second node;
a first capacitive element connected between said second node and said first clock terminal; and
a eighth transistor discharging said second output terminal, aside from said fourth transistor,
said eighth transistor having a control terminal connected to a second clock terminal which receives a second clock signal having a different phase from said first clock signal.

12. The shift register circuit according to claim 11, wherein said eighth transistor is connected between said second output terminal and said first clock terminal.

13. The shift register circuit according to claim 1, further comprising:
a first capacitive element connected between said first node and a second clock terminal which receives a second clock signal having a different phase from said first clock signal.

14. A shift register circuit which is a multi-stage shift register circuit, each stage of which is the shift register circuit according to claim 1, wherein in said each stage,
said first input terminal is connected to said first output terminal of the preceding stage,
said second input terminal is connected to said second output terminal of the preceding stage, and
said reset terminal is connected to said first or second output terminal of a succeeding stage.

15. The shift register circuit according to claim 14, wherein in said each stage,
a level transition of an output signal from said second output terminal is faster than that of an output signal from said first output terminal.

16. The shift register circuit according to claim 1, wherein said sixth transistor is connected between said first node and said first or second input terminal, and
said reset terminal receives a second clock signal having a different phase from said first clock signal.

17. A shift register circuit which is a multi-stage shift register circuit, each stage of which is the shift register circuit according to claim 16, wherein in said each stage,
said first input terminal is connected to said first output terminal of the preceding stage,
said second input terminal is connected to said second output terminal of the preceding stage, and
said fifth clock signal has the same phase as a clock signal inputted to said first clock terminal of the preceding stage.

18. The shift register circuit according to claim 17, wherein in
said each stage,
a level transition of an output signal from said second output terminal is faster than that of an output signal from said first output terminal.

19. An image display apparatus comprising a gate line driving circuit that is constituted by a multi-stage shift register circuit and that drives gate lines of a display panel, wherein each stage of said multi-stage shift register circuit comprises:
first and second input terminals, first and second output terminals, a first clock terminal, and a reset terminal;
a first transistor supplying a first clock signal inputted to said first clock terminal to said first output terminal;
a second transistor discharging said first output terminal;
a third transistor supplying said first clock signal to said second output terminal;
a fourth transistor discharging said second output terminal;
a fifth transistor connected between a predetermined node and said first input terminal and having a control electrode connected to said second input terminal, said predetermined node being connected to control electrodes of both said first and third transistors; and a sixth transistor having a control electrode connected to said reset terminal and discharging said predetermined node, wherein in said each stage, said first input terminal is connected to said first output terminal of the preceding stage, said second input terminal is connected to said second output terminal of the preceding stage, said first output terminal is connected to a corresponding one of said gate lines of said display panel, and said reset terminal is connected to said first or second output terminal of a succeeding stage.

20. An image display apparatus comprising a gate line driving circuit that is constituted by a multi-stage shift register circuit and that drives gate lines of a display panel, wherein each stage of said multi-stage shift register circuit comprises:

first and second input terminal, first and second output terminals, a first clock terminal and a reset terminal;

a first transistor supplying a first clock signal inputted to said first clock terminal to said first output terminal;

a second transistor discharging said first output terminal;

a third transistor supplying said first clock signal to said second output terminal;

a fourth transistor discharging said second output terminal;

a fifth transistor connected between a predetermined node and said first input terminal and having a control electrode connected to said second input terminal, said predetermined node being connected to control electrodes of both said first and third transistors; and a sixth transistor having a control electrode connected to said reset terminal and discharging said predetermined node, wherein in said each stage, said sixth transistor is connected between said predetermined node and said first or second input terminal, said reset terminal receives a second clock signal having a different phase from said first clock signal, said first input terminal is connected to said first output terminal of the preceding stage, said second input terminal is connected to said second output terminal of the preceding stage, said first output terminal is connected to a corresponding one of said gate lines of said display panel, and said second clock signal has the same phase as a clock signal inputted to said first clock terminal of the preceding stage.

21. A shift register circuit which is a multi-stage shift register circuit, each stage of which is the shift register circuit according to claim 1, wherein in a first stage of the multi-stage shift register circuit, a same pulse signal is input to the first and second input terminals.

* * * * *